(12) United States Patent
La Rosa et al.

(10) Patent No.: US 8,901,634 B2
(45) Date of Patent: Dec. 2, 2014

(54) NONVOLATILE MEMORY CELLS WITH A VERTICAL SELECTION GATE OF VARIABLE DEPTH

(71) Applicant: STMicroelectronics (Rousset) SAS, Rousset (FR)

(72) Inventors: Francesco La Rosa, Rousset (FR); Yoann Goasduff, Fuveau (FR); Stephan Niel, Greasque (FR); Arnaud Regnier, Les Taillades (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 13/786,213

(22) Filed: Mar. 5, 2013

(65) Prior Publication Data
US 2013/0228846 A1    Sep. 5, 2013

(30) Foreign Application Priority Data

| Mar. 5, 2012 | (FR) | 12 51968 |
|---|---|---|
| Mar. 5, 2012 | (FR) | 12 51969 |
| Mar. 5, 2012 | (FR) | 12 51970 |
| Apr. 11, 2012 | (FR) | 12 53330 |
| Nov. 21, 2012 | (FR) | 12 61093 |

(51) Int. Cl.
| *H01L 29/788* | (2006.01) |
| *G11C 16/04* | (2006.01) |
| *H01L 29/66* | (2006.01) |
| *H01L 27/115* | (2006.01) |

(52) U.S. Cl.
CPC ........ *H01L 29/7889* (2013.01); *G11C 16/0483* (2013.01); *H01L 29/66825* (2013.01); *G11C 16/0425* (2013.01); *H01L 27/11524* (2013.01)

USPC .......................................... 257/321

(58) Field of Classification Search
CPC ............ H01L 27/115; H01L 27/11524; H01L 27/1157; H01L 27/1156; H01L 27/11529; H01L 27/11556; H01L 27/11559; H01L 29/7889; H01L 29/66825; H01L 29/66704; H01L 29/4236; H01L 29/1157
USPC .......................... 438/257–267; 257/314–321
See application file for complete search history.

(56) References Cited

U.S. PATENT DOCUMENTS

| 6,906,376 B1 | 6/2005 | Hsu et al. | |
|---|---|---|---|
| 2002/0153546 A1* | 10/2002 | Verhaar | 257/296 |
| 2004/0130947 A1 | 7/2004 | Fan et al. | |
| 2008/0080244 A1 | 4/2008 | Lee et al. | |
| 2008/0165582 A1 | 7/2008 | Georgescu et al. | |
| 2009/0003074 A1 | 1/2009 | Georgescu et al. | |
| 2009/0158226 A1* | 6/2009 | Ho et al. | 716/5 |

* cited by examiner

*Primary Examiner* — Brook Kebede
(74) *Attorney, Agent, or Firm* — Seed IP Law Group PLLC

(57) ABSTRACT

The disclosure relates to an integrated circuit comprising at least two memory cells formed in a semiconductor substrate, and a buried gate common to the selection transistors of the memory cells. The buried gate has a first section of a first depth extending in front of vertical channel regions of the selection transistors, and at least a second section of a second depth greater than the first depth penetrating into a buried source line. The lower side of the buried gate is bordered by a doped region forming a source region of the selection transistors and reaching the buried source line at the level where the second section of the buried gate penetrates into the buried source line, whereby the source region is coupled to the buried source line.

20 Claims, 22 Drawing Sheets

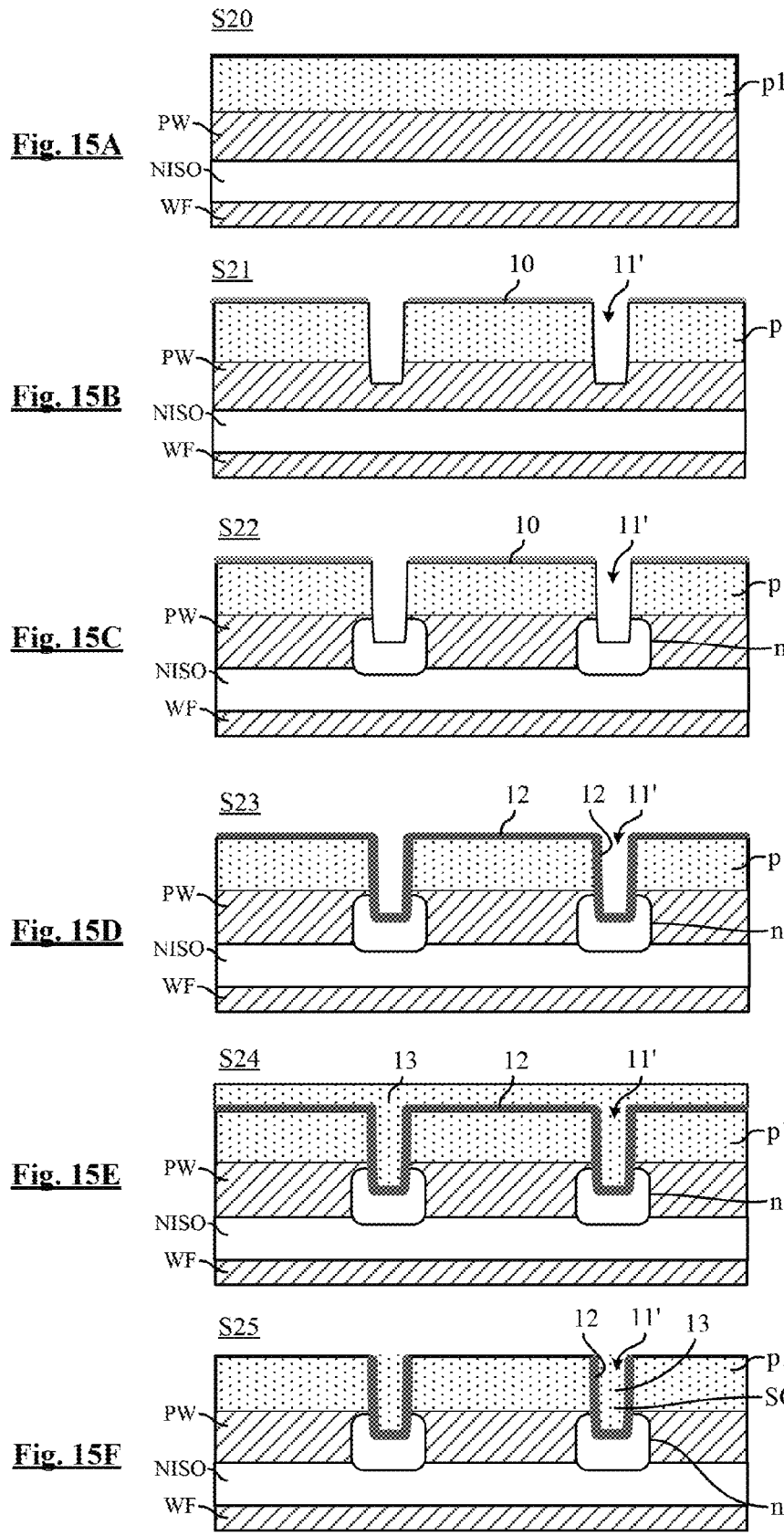

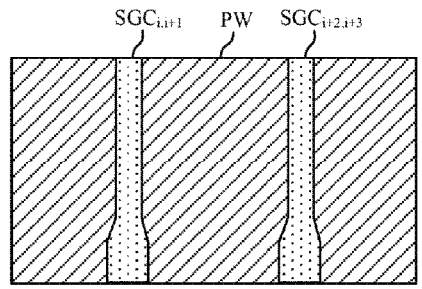
S30  Fig. 16A
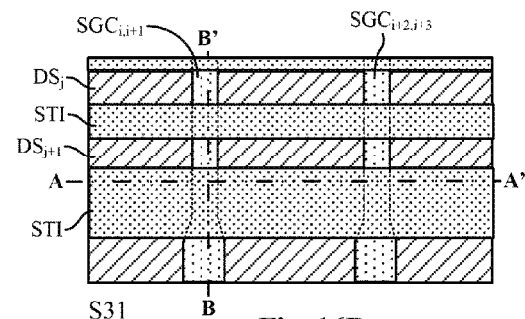
S31  Fig. 16B
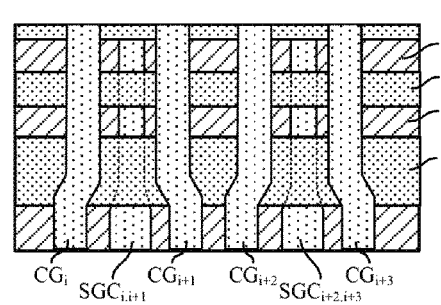
S32  Fig. 16C
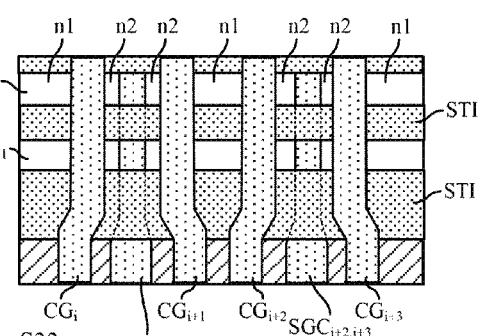
S33  Fig. 16D
Fig. 16E
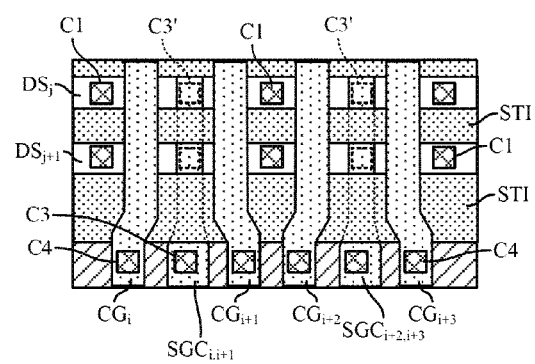
S34
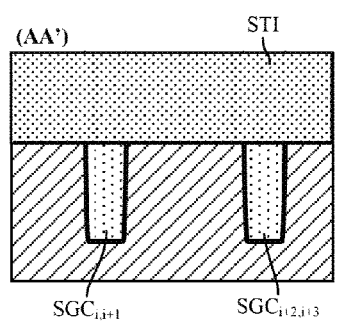
Fig. 17A
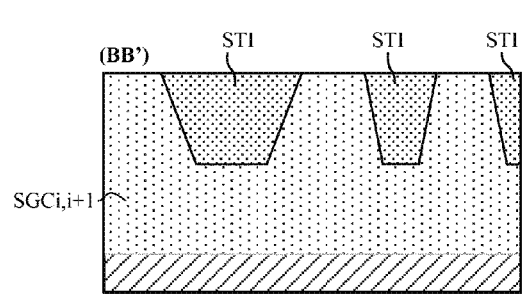
Fig. 17B

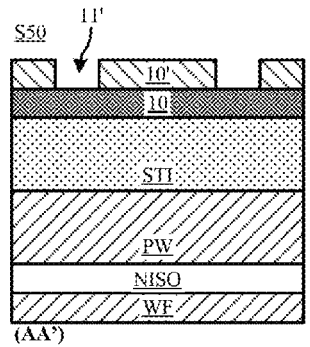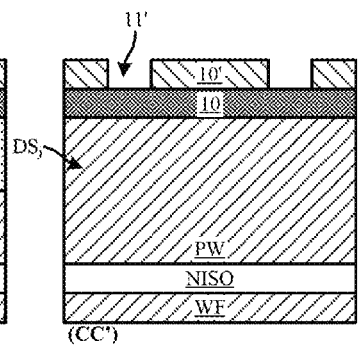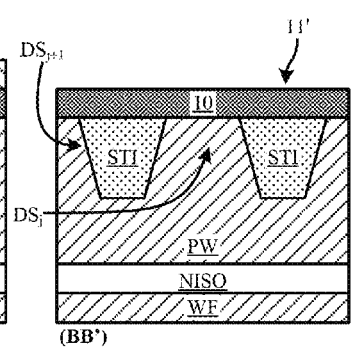
Fig. 38A  Fig. 38B  Fig. 38C
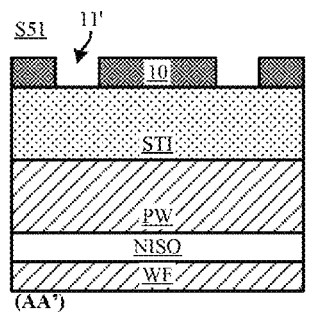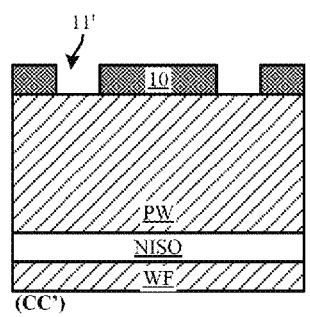
Fig. 39A  Fig. 39B
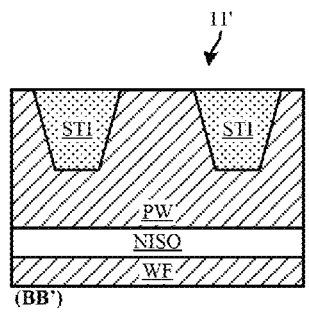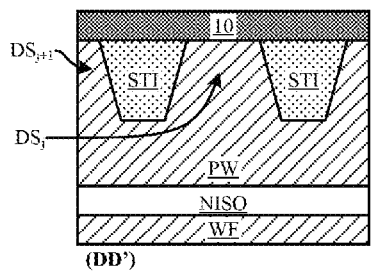
Fig. 39C  Fig. 39D

NONVOLATILE MEMORY CELLS WITH A VERTICAL SELECTION GATE OF VARIABLE DEPTH

BACKGROUND

1. Technical Field

The present disclosure relates to nonvolatile memories in integrated circuits on semiconductor chips. More particularly, the present disclosure relates to memories comprising memory cells with programming and erasure by tunneling, called Uniform Channel Program or UCP memory cells. More particularly, the present disclosure relates to UCP memory cells with two transistors, comprising a selection transistor and a charge accumulation transistor, such as a floating gate transistor.

2. Description of the Related Art

FIG. 1 is a schematic cross-sectional view of two memory cells C11, C12 of UCP type, fabricated on a P-type substrate PW. Each memory cell C11, C12 comprises a floating gate transistor FGT11, FGT12 and a selection transistor ST11, ST12. Each floating gate transistor comprises a drain region n1 (D), a source region n2 (S), a floating gate FG, a control gate CG, and a channel region CH1 extending under the floating gate FG between the drain n1 and source n2 regions. Each selection transistor ST11, ST12 comprises a drain region n2 (D) common to the source region n2 of the corresponding floating gate transistor FGT11, FGT12, a source region n3 (S), a gate SG, and a channel region CH2 extending under the gate SG between the drain n2 and source n3 regions. The two transistors ST11, ST12 share the same source region n3.

Regions n1, n2, n3 are generally formed by N doping of the substrate PW. The substrate is generally a P-type well formed in a semiconductor wafer WF. The well PW is isolated from the rest of the wafer WF by an N-doped isolation layer NISO that surrounds the entire well. The gates FG, SG are generally of a first layer of polycrystalline silicon "poly1", and are formed on the substrate PW over oxide layers D1, D2, layer D1 being a tunneling oxide layer whereas layer D2 is a gate oxide layer. The control gate CG is generally of a second layer of polycrystalline silicon "poly2", and is formed on the floating gate FG over an oxide layer D3.

The two memory cells are covered by a dielectric isolating material D0, which may also be of oxide SiO2. The drain regions n1 of transistors FGT11, FGT12 are coupled to a same bitline BL by means of a contact C1 traversing the isolation D0 to reach an intermediary conductor T1 of a first layer of metal "metal1", and of a conductive via V1 traversing the isolation D0 to couple the conductor T1 to the bitline BL in a second layer of metal "metal2". The source region n3 common to the two transistors ST11, ST12 is coupled to a source line SL by means of a contact C2 traversing the isolation D0, the source line SL being for example in the first metal layer.

In relation with FIG. 2, table REF1 in Annex describes the voltages applied to the memory cells C11, C12, FIG. 2 showing their equivalent electrical diagram. In relation with FIG. 3, table RD1 in Annex describes voltages values applied to the memory cells during a read of the memory cell C11. Column "Ref." describes the reference attributed to each voltage value, and the column "Ex." describes example voltage values. Reference "GND" is the ground potential, that is, the potential of wafer WF, generally 0V.

Thus, during a read of cell C11, the selection transistor ST12 receives the blocking voltage Voff and is not conducting. A current (represented by an arrow in FIG. 3) flows through the channel region CH1 of the transistor FGT11 and through the channel region CH2 of the transistor ST11. This current is representative of the threshold voltage of the transistor FGT11. The threshold voltage is representative of a programmed or erased state of the transistor, which depends on a quantity of electrical charges stored in its floating gate. This current is sensed by a sense amplifier, not shown in the figure, which supplies a binary data stored by the cell C11.

The selection transistor ST12 being blocked by the voltage Voff, the value of the voltage "no-read" Vnread applied to the floating gate transistor FGT12 is unimportant because this transistor is isolated from the source region n3 by the transistor ST12. In the table RD1, this voltage is chosen to be equal to the biasing voltage VB1 of the substrate PW, here the ground potential GND.

Cells C11, C12 have the advantage of being programmable or erasable by application of a pair of determined voltages to the substrate PW and to the control gate CG of their transistor FGT11, FGT12. This programming or erasing mode is called "programming and erasing by the channel". To give an idea, table ER1 in Annex discloses voltage values applied to the memory cells during erasure of the cell C11. Table PG1 in Annex discloses voltage values applied to memory cells during programming of the cell C11. Reference "HZ" designates the high impedance state (open circuit).

The transfer of charges from the substrate PW to the floating gate FG (programming) or from the floating gate to the substrate (erasure) is done without using the selection transistor ST11, by applying a high voltage difference (here 15V) allowing this charge transfer. Thus, the steps of programming, erasure, and read are performed with low value voltages by exploiting the potential difference between the substrate and the control gate of floating gate transistors. Thus, the selection transistors ST11, ST12 are not subjected to high voltages, which allows memory cells C11, C12 to be provided that are simple to design and do not occupy a lot of semiconductor surface area.

Despite the advantages offered by such UCP memory cells, it may be desired to provide a means allowing their surface area to be decreased even further, in order to reduce the surface area of a memory array comprising a plurality of such memory cells. It may also be desired to provide a memory structure of small surface area.

BRIEF SUMMARY

One embodiment of the disclosure is an integrated circuit comprising at least two memory cells formed in a semiconductor substrate, each comprising a selection transistor, wherein the integrated circuit further comprises a buried gate common to the selection transistors of the memory cells, the buried gate has a first section of a first depth extending in front of vertical channel regions of the selection transistors, and at least a second section of a second depth greater than the first depth penetrating into a buried source line, and the lower side of the buried gate is bordered by a doped region forming a source region of the selection transistors and reaching the buried source line at the level where the second section of the buried gate penetrates into the buried source line, whereby the source region is coupled to the buried source line.

According to one embodiment, the memory cells are formed in a well delimited by an isolation layer forming said buried source line.

According to one embodiment, the integrated circuit comprises at least one conductive trench with a crenellated lower side defining, in the conductive trench, a plurality of first sections of the first depth and of second sections of the second depth, each first section forming the common gate of a selection transistor of a memory cell of a first row of memory cells and of a selection transistor of a memory cell of a second row of memory cells.

According to one embodiment, the integrated circuit comprises at least one isolating trench perpendicular to the conductive trench, and a junction zone of the conductive trench with the isolating trench delimiting two sections, each section forming the common gate of a selection transistor of a memory cell of a first row of memory cells and of a selection transistor of a memory cell of a second row of memory cells.

According to one embodiment, the memory comprises at least two rows of memory cells, each comprising groups of individually-erasable memory cells formed in different wells.

One embodiment of the disclosure is a method of manufacturing on a semiconductor substrate at least two memory cells, each comprising a selection transistor, comprising the steps of implanting a buried source line in the substrate, forming in the substrate a common buried gate of the selection transistors, the buried gate having a first section of a first depth, and at least a second section of a second depth greater than the first depth penetrating into a buried source line, and bordering a lower side of the buried gate with a doped region forming a source region of the selection transistors and reaching the buried source line at the level where the second section of the buried gate penetrates into the buried source line, whereby the source region is coupled to the buried source line.

According to one embodiment, the method further comprises implanting in the substrate an isolation layer surrounding a well in which the memory cells are formed and also forming said buried source line.

According to one embodiment, forming a common buried gate comprises forming isolation trenches in the substrate, selectively etching the isolation trenches along a line perpendicular to the isolation trenches, to form along said line first non-etched regions of the substrate and second etched regions passing through the isolation trenches and reaching the substrate, etching the substrate in the first non-etched regions and second etched regions to form a trench having first regions of first depth and second regions of second depth, depositing an isolation layer in the trench, and filling the trench with a conductive material.

According to one embodiment, bordering a lower side of the buried gate with a doped region comprises implanting the doped regions in the substrate through a lower side of the trench before depositing an isolation layer in the trench.

BRIEF DESCRIPTION OF THE SEVERAL VIEWS OF THE DRAWINGS

Embodiments of a method of reading memory cells, memory cells structures, and memory structures according to the disclosure will be described in the following in a non-limiting manner, in relation with the appended drawings in which:

FIGS. 15A to 15F are cross-sectional views showing a variation of steps shown in FIGS. 14A to 14E, FIGS. 16A to 16E are top views showing other steps of a method according to the disclosure of manufacturing memory cells, FIGS. 17A, 17B are cross-sectional views of a step shown in FIG. 16B, FIGS. 18A to 18E are top views showing a variation of steps shown in FIGS. 16A to 16E, FIGS. 19A, 19B are cross-sectional views of a step shown in FIG. 18B, FIGS. 38A to 42C are cross-sectional views showing steps of a method of manufacturing the memory cells shown in FIGS. 37A, 37B, 37C.

DETAILED DESCRIPTION

Figure 1:
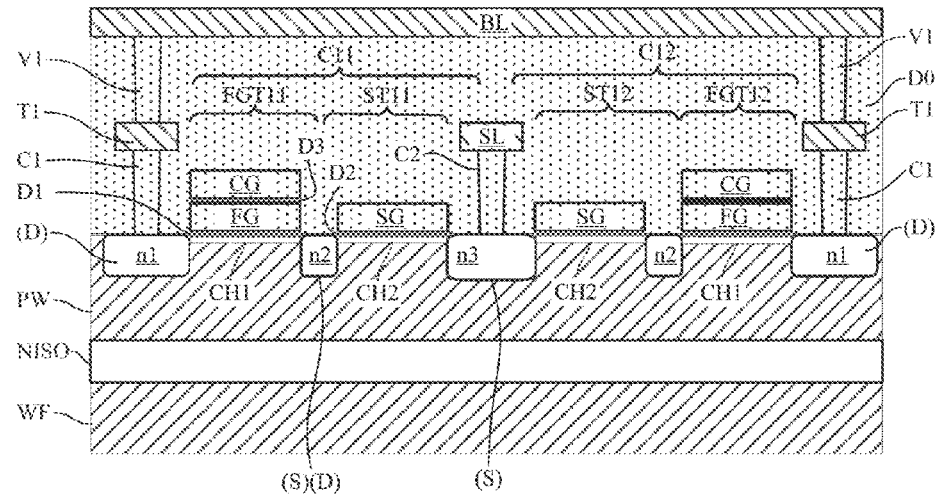
FIG. 1, previously described, is a schematic cross-sectional view of a pair of conventional memory cells, FIG. 2, previously described, is the electric diagram of the memory cells, FIG. 3, previously described, shows a conventional read method of a memory cell of the pair of memory cells of FIG. 1.
Figure 2:
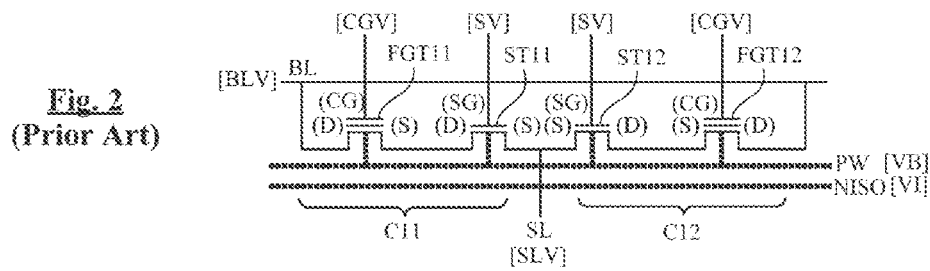
Figure 3:
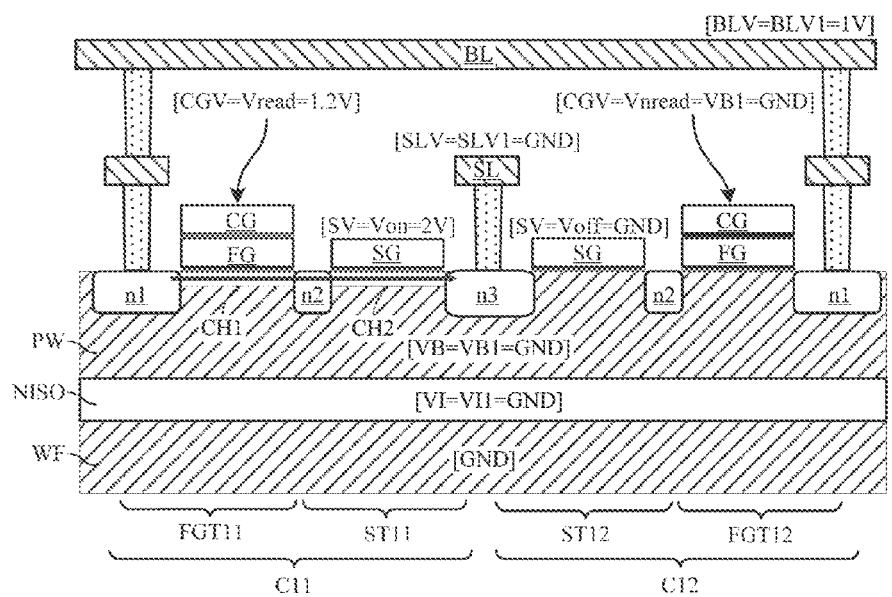
Figure 4:
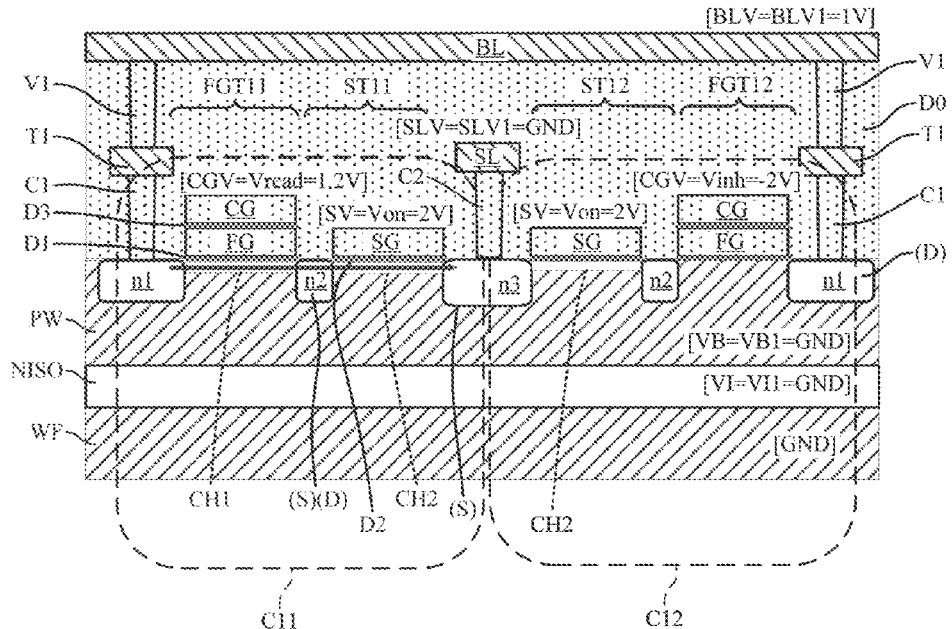
FIG. 4 shows a method according to the disclosure of reading a memory cell of the pair of conventional memory cells of FIG. 1.

In relation with FIG. 4, table RD2 in Annex 1 describes a method according to the disclosure of reading the memory cells C11, C12 shown in FIG. 1. The voltages listed in the first column of the table were previously described in relation with the table REF1. The example described here relates to the read of the memory cell C11. The cell C12 may be read in a similar manner by applying to it the voltages applied to the cell C11, and vice-versa.

The read method produces an effect similar to that described by the table RD1: the cell C11 is conducting and is traversed by a current that also traverses the bitline BL. This current is sensed by a sense amplifier (not shown).

This method differs from that described by the table RD1 in that the gates of the two selection transistors ST11 and ST12 receive the selection voltage during read Von, the non-selection voltage during read Voff no longer being used for the considered pair of memory cells. Thus, the selection transistor ST12 of the cell C12 is set in the conducting state and has a conductive channel in its channel region CH2. To prevent a current from flowing through the non-selected cell C12, the voltage CGV applied to the control gate of the transistor FGT12, instead of being equal to the non-read voltage Vnread, is equal to an inhibition voltage Vinh, which forces the transistor FGT12 into the blocked state and prevents it from conducting. The inhibition voltage Vinh, here negative, is chosen to be less than the lowest possible value of the threshold voltage of the transistor FGT12 in order to ensure that the transistor FGT12 remains in the blocked state. The threshold voltage is a function of the state of the transistor, programmed or erased. In other words, the selection transistor ST12, usually used for the selection for read of a memory cell, is no longer used for its usual function for the pair of memory cells considered, and the floating gate transistor FGT12 is forced into the blocked state.

Thus, a feature of this read method is that the voltages applied to the gates of the selection transistors ST11, ST12 are identical no matter which memory cell is read in the pair of memory cells. It will be noted that this feature of the read method concerns two neighboring memory cells forming a pair, that is to say, sharing the same source region and coupled to the same bitline. In general, it relates to two rows of memory cells constituted of neighboring memory cells coupled to the same group of bitlines. This feature does not relate to other memory cells, the selection transistors of which are conventionally set in the blocked state during the read of one of these memory cells.

This feature brings together two other features that appear in the tables ER1 and PG1, that is, the voltages applied to the gates of selection transistors ST11, ST12 during the erasure or the programming of a memory cell of the pair of memory cells, are themselves identical, regardless of whether the memory cell is erased or programmed. By combining these features, it appears that the two selection transistors of a pair of memory cells may receive the same voltage regardless of the process to perform (read, erase, or program), and regardless of which memory cell is the object of this process. This combination of features allows structural modifications of pairs of memory cells in order to decrease their surface area, as will now be described.

Figure 5:
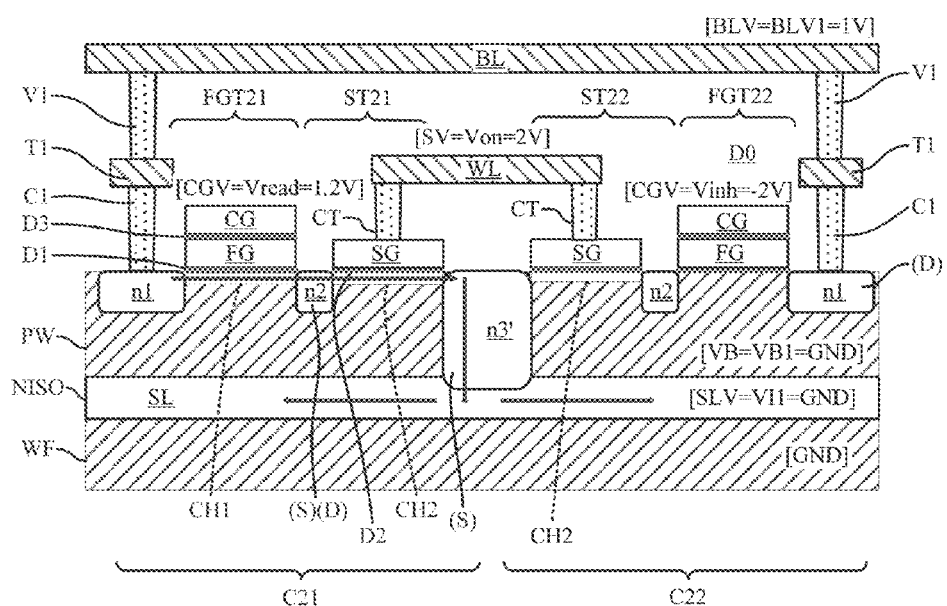
FIG. 5 is a schematic cross-sectional view of a first embodiment of a pair of memory cells according to the disclosure.

FIG. 5 shows a first embodiment of a pair of memory cells C21, C22 according to the disclosure. Each memory cell C21, C22 comprises a floating gate transistor FGT21, FGT22 and a selection transistor ST21, ST22. The structure of memory cells C21, C22 is identical to that of the memory cells C11, C12 with the exception of two features:

1) The gates SG of the selection transistors ST21, ST22 are coupled to a common wordline WL. The wordline WL is for example formed in the first metal layer "metal1" and is coupled to the gates of the transistors by contacts CT traversing the dielectric layer D0 that covers the two memory cells.

2) The conventional source line SL (Cf. FIG. 4) is not present. The source region n3 of the transistors ST11, ST12 shown in FIG. 4 is replaced by a source region n3' of the transistors ST21, ST22 that is deeper than the source region n3 and reaches the buried NISO layer delimiting the well PW in which the two memory cells are implanted. Thus, the source region n3' and the NISO layer are at the same electrical potential, and the NISO layer is used as a source line SL.

These two features are independent of each other and are shown in the same drawing merely for convenience. The absence of the source line and its replacement by the NISO layer allows the structure to be simplified of higher metal layers. Moreover, as the NISO layer has the form of a plate delimited by vertical sidewalls, it has a lower electrical resistance than a layer of doped semiconductor in the form of a strip.

The feasibility of using the NISO layer as a source line may be demonstrated by considering, in the tables RD2, ER1 and PG1, the electrical voltages applied to the source line SL and to the NISO layer:

1) Table RD2 shows that the electrical potential SLV of the source line is the same as the potential VI of the NISO layer during the read of a memory cell, that is, the ground potential GND. Thus, the NISO layer may be used as a source line during the read of a memory cell.

2) Table ER1 shows that, during erasure of a memory cell, the source line voltage SLV is brought to a floating potential SLV2=HZ, whereas the voltage V1 of the NISO layer is brought to a potential VI2=5 V. Nevertheless, the selection transistors are not conducting because the voltage SV applied to their gates (SV=SV2=5V) is identical to that of the substrate (VB=VB2=5V), such that no conductive channel can form in their channel region CH2. In these conditions, the source line SL may be brought to the potential of the NISO layer instead of being left floating, without the erase process being affected. It is thus equally possible to use the NISO layer as a source line during an erase process without modifying its potential, so that its isolation function, which employs this potential, may be conserved.

3) Finally, table PG1 shows that during the programming of a memory cell, the voltage SLV of the source line is brought to a floating potential SLV2=HZ, whereas the voltage V1 of the NISO layer is brought to a potential VI2=GND. As the selection transistors are also not conducting during the programming of the memory cell, the source line SL may be brought to the ground potential GND instead of being left floating, without the programming process being disturbed. It is therefore also possible to use the NISO layer as the source line during the programming process without modifying its potential.

Table REF2 in Annex 1 describes the voltages applied to the memory cells C21, C22. Except for the references attributed to the different transistors, table REF2 is identical to the table REF1. The voltage NISO is no longer present and is considered as forming the source line voltage SLV.

In relation with FIG. 5, table RD3 in Annex 1 describes voltage values applied to the memory cells during the read of the memory cell C21. Except for the references attributed to the different transistors, the read method is identical to that described by the table RD2.

Figure 6:
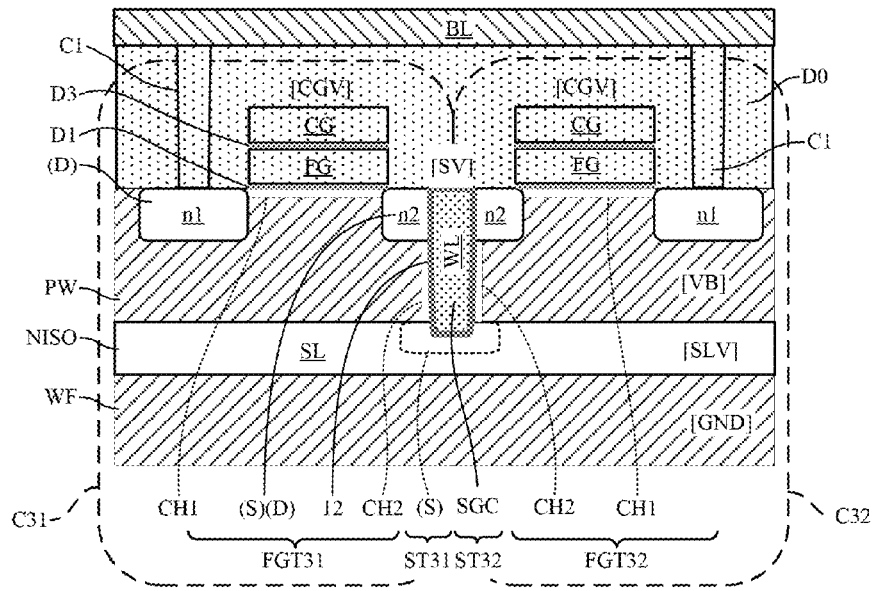
FIG. 6 is a schematic cross-sectional view of a second embodiment of a pair of memory cells according to the disclosure.

FIG. 6 shows a second embodiment of memory cells C31, C32 according to the disclosure. Each memory cell C31, C32 comprises a floating gate transistor FGT31, FGT32 and a selection transistor ST31, ST32. The transistors FGT31, FGT32 are of the same structure as the transistors FGT21, FGT22 and each has a horizontal channel region CH1 extending beneath its floating gate FG, between the drain n1 and source n2 regions. The selection transistors ST31, ST32 are distinguished from the selection transistors ST21, ST22 of FIG. 5 in that they comprise a common vertical gate SGC. This vertical gate SGC is buried in the substrate PW and is electrically isolated from adjacent structures by means of an isolating layer 12, for example of oxide SiO2, forming the gate oxide of the selection transistors ST31, ST32. It extends longitudinally vertically into the substrate PW from an upper surface of the substrate PW and has lower left and right edges that penetrate into the layer NISO. The layer NISO thus forms, in its portion surrounding the lower left and right edges of the gate SGC, the source region (S) of the transistors ST31, ST32. As previously, the layer NISO also forms the source line SL of these transistors. The drain regions n2 (D) of the transistors ST31, ST32 (which also form the source regions of floating gate transistors) are conserved, but respectively extend along an upper left edge and an upper right edge of the gate SGC.

Thus, the transistor ST31 has a vertical channel region CH2 that extends in front of the left vertical wall of the gate SGC, between the first region n2 and the NISO layer. Similarly, the transistor ST32 has a vertical channel region CH2 that extends in front of the right vertical wall of the gate SGC, between the second region n2 and the NISO layer.

With respect to the structure of the pair of memory cells C21, C22, the structure of the pair of memory cells C31, C32 has the advantage of occupying much less semiconductor substrate surface area, due to the absence at the surface of the substrate of the selection transistors ST31, ST32, which are now buried transistors having a common gate.

As it will be seen later in light of manufacturing method examples, the vertical gate SGC is formed from a conductive trench that couples several pairs of memory cells, shown in cross-section in FIG. 6. According to the manufacturing method implemented, this trench may have no electrical discontinuity. It may therefore be used directly as a wordline WL, as indicated by the reference "WL" in FIG. 6. In other embodiments, this trench may be severed into different segments by isolation trenches STI ("Shallow Trench Isolation") described later. In this case, each vertical gate SGC of each pair of memory cells or group of memory cells coupled to a given segment is independent of the others and must be individually coupled to a wordline in a metal layer.

Figure 7:
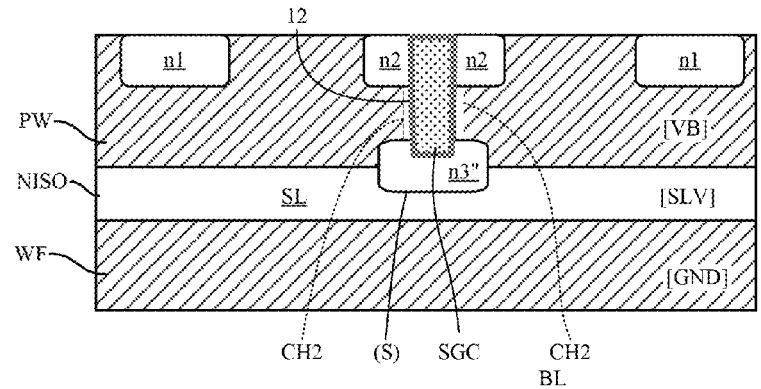
FIG. 7 shows an implementation variation of an element of the pair of memory cells of FIG. 6.

FIG. 7 shows an embodiment in which the vertical gate SGC does not extend deep enough into the substrate PW to reach the NISO layer. A doped region n3" is therefore implanted between the lower extremity of the gate SGC and the NISO layer. The region n3" surrounds the lower left and right edges of the gate SGC and forms the source region (S) of the transistors ST31, ST32. The region n3" extends until the NISO layer that it electrically couples to the source region of the transistors ST31, ST32.

Figure 8:
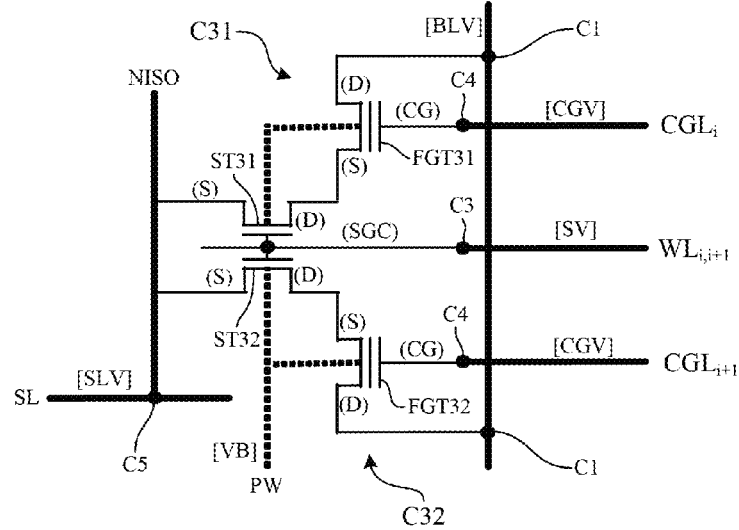
FIG. 8 is the electrical diagram of the pair of memory cells of FIG. 6.

FIG. 8 is the electrical diagram of memory cells C31, C32. The control gate of the transistor FGT31 is coupled to a control gate line CGL, by means of a contact C4. The control gate of the transistor FGT32 is coupled to a control gate line $CGL_{i+1}$ by means of a contact C4. The drain regions (D) of transistors FGT31, FGT32 are coupled to a bitline BL by means of contacts C1. The vertical gate SGC is coupled to a wordline $WL_{i,i+1}$ common to two memory cells by means of a contact C3. Alternatively, the vertical gate SGC may itself form the wordline $WL_{i,i+1}$, as indicated above. The channel regions of the transistors FGT31, FGT32, ST31, ST32 are at the electrical potential of the well PW, as shown by dotted lines. Finally, the source regions (S) of the transistors ST31, ST32 are electrically coupled to the NISO layer forming the source line, which may be coupled by means of a contact C5 to a general source line SL formed in a metal layer.

In relation with FIG. 6, table REF3 in Annex 1 describes the voltages applied to the memory cells C31, C32. Except the references attributed to different transistors, table REF3 is identical to the table REF2. The voltage SLV is now a unique voltage applied to the common gate SGC of the transistors ST31, T32.

Figure 9:
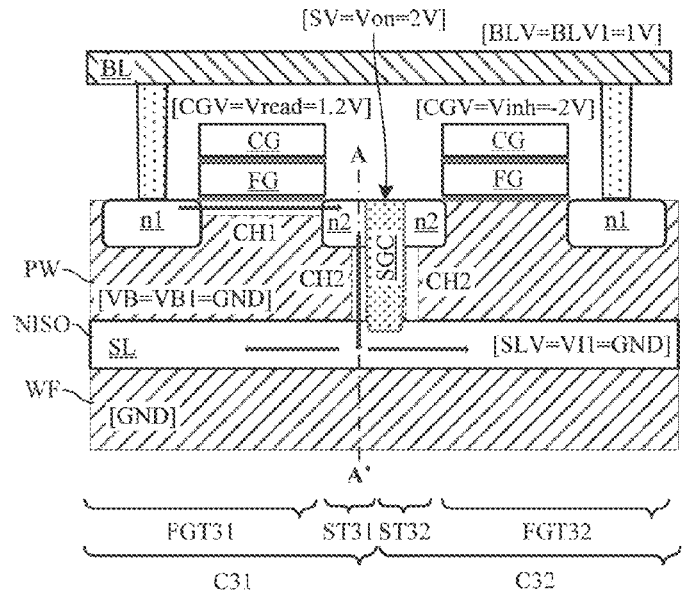
FIG. 9 shows a method according to the disclosure of reading a memory cell of the pair of memory cells of FIG. 6.

In relation with FIG. 9, table RD4 in Annex 1 describes voltage values applied to the memory cells during the read of the memory cell C31. Table RD4 is identical to table RD3 except for the references of the memory cells and of the transistors. Thus, in read, the memory cells C31, C32 are equivalent to the memory cells C21, C22.

In FIG. 9, arrows show a current traversing the channel region CH1 of the transistor FGT31 and the vertical channel region CH2 of the transistor ST31. A conductive channel also appears in the vertical channel region CH2 of the transistor ST32, under the effect of the voltage SV=Von applied to the common gate SGC, but the associated floating gate transistor FGT32 remains blocked under the effect of the inhibition voltage Vinh.

Figure 10:
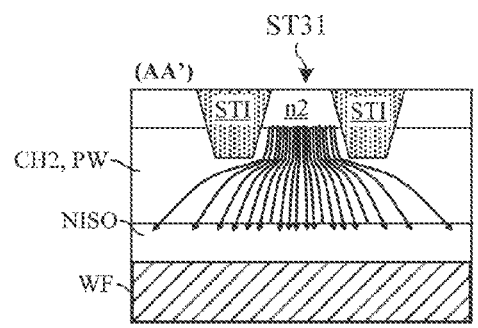
FIG. 10 is a transversal cross-sectional view of a portion of the pair of memory cells of FIG. 9, FIGS. 11 and 12 respectively show steps of erasing and of programming a memory cell of the pair of memory cells of FIG. 6.

FIG. 10 is a transversal cross-sectional view of the transistor ST31 along the cutting axis AA' shown in FIG. 9. The cutting plane traverses the drain region n2 of the transistor, the vertical channel region CH2 that extends in the substrate PW, the NISO layer, and the wafer WF. It may be seen that the transistor is formed between two isolation trenches STI, which do not reach the NISO layer here. Arrows show the distribution of current in the channel region CH2, between the drain region n2 and the source region formed by the NISO layer. The channel region has a narrow portion between the two isolation trenches STI and a portion of indeterminate width where the current lines are no longer channeled by the isolation trenches STI and spread out until they reach the NISO layer. Contrary to a conventional selection transistor, the transistor ST31 has a conductive channel of variable width.

Figure 11:
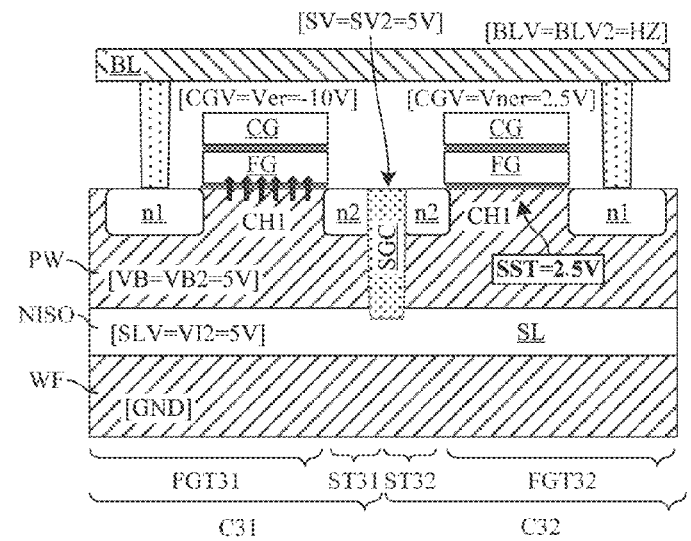

In relation with FIG. 11, table ER2 in Annex 1 describes voltage values applied to memory cells during the erasure of the memory cell C31. The erasing method described by the table ER2 differs from that described by the table ER1 in that the voltage SLV of the source line, formed by the NISO layer, is equal to the voltage V12 applied to the NISO layer in the method described by the table ER1.

In FIG. 11, arrows show that an electrical field appears between the substrate PW and the floating gate FG of the transistor FGT31. This electrical field extracts electrons from the floating gate by tunnel effect (the Fowler Nordheim effect). Moreover, the transistor FGT32 is subjected to a "Soft Stress" SST due to the potential difference between the substrate PW and its control gate, here equal to 2.5 V. This soft stress effect is insufficient to extract significant electrical charges from the floating gate of this transistor.

Figure 12:
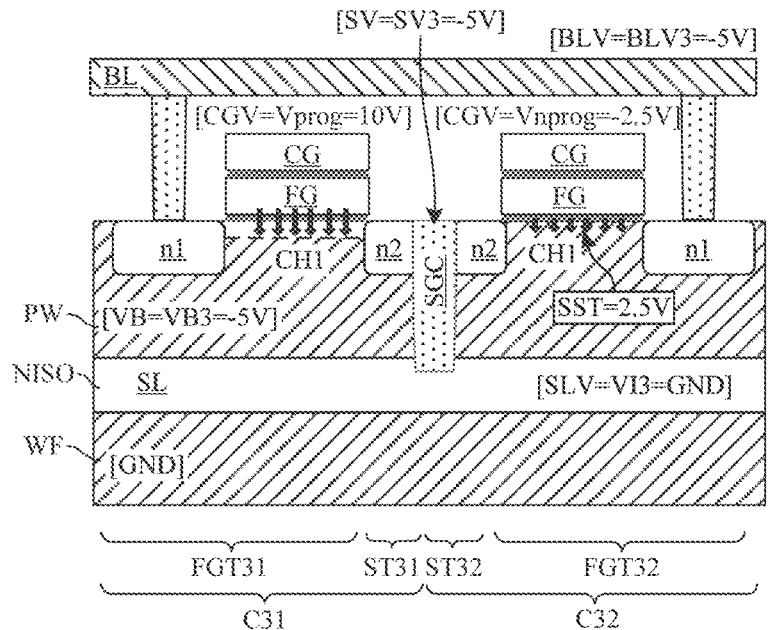

In relation with FIG. 12, table PG2 in Annex 1 describes voltage values applied to the memory cells during the programming of the memory cell C31. The method of programming described by the table PG2 differs from that described by the table PG1 in that the source line voltage SLV, formed by the NISO layer, is equal to the voltage V13 applied to the NISO layer in the method described by the table PG1.

In FIG. 12, arrows show that an electrical field appears between the substrate PW and the floating gate FG of the transistor FGT31. This electrical field causes a conductive channel to appear in the channel region CH1 of the transistor FGT31, and causes the injection of electrons into the floating gate by tunnel effect (the Fowler Nordheim effect). Moreover, the transistor FGT32 is subjected to a soft stress effect SST due to the potential difference between the substrate PW and its control gate, here equal to −2.5 V. This soft stress effect is insufficient to inject electrical charges into the floating gate of this transistor.

Figure 13:
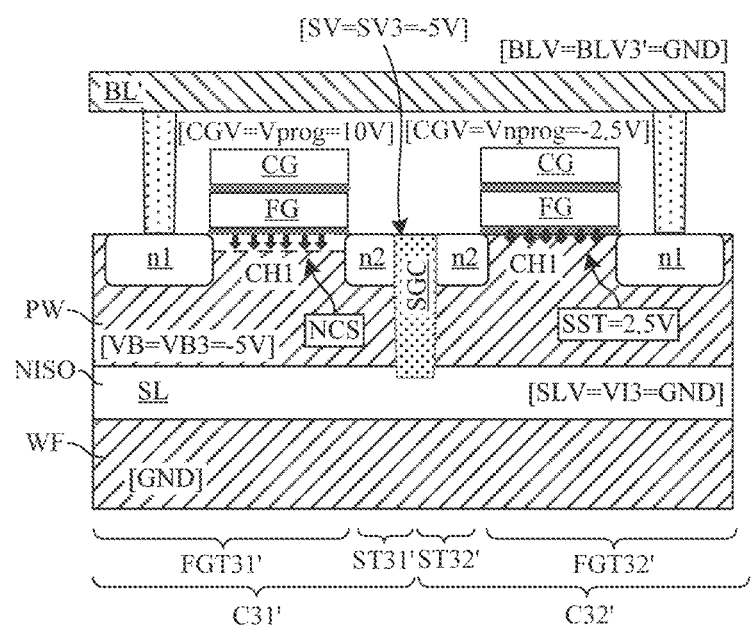
FIG. 13 shows voltages sustained by neighboring memory cells during the programming step of FIG. 12, FIGS. 14A to 14E are cross-sectional views showing steps of method according to the disclosure of manufacturing memory cells.

In relation with FIG. 13, table PG2' in Annex 1 describes voltage values sustained by neighboring memory cells C31', C32' during the step of programming the memory cell C31 shown in FIG. 12. These neighboring memory cells C31', C32' are coupled to the same wordline and to the same control gate lines as the memory cells C31, C32, but are coupled to a different bitline BL'. With respect to the cutting plane of FIG. 12, these memory cells C31', C32' are "in front of" or "behind" the memory cells C31, C32 of FIG. 12.

These memory cells receive the same voltages as the memory cells C31, C32, except for the bitline voltage BLV, which is brought to a non-programming voltage BLV3', for example the ground potential GND.

The transistor FGT32' is subjected to a soft stress effect SST due to the difference in potential between the substrate PW and its control gate, here equal to −2.5 V. This soft stress effect is insufficient to inject electrical charges into the floating gate of this transistor. The transistor FGT31' is subjected to a non cumulative stress NCS due to the potential difference of 15 V between the substrate PW and its control gate. Nevertheless, as its drain region n1 is coupled to ground by means of the bitline BL', the conductive channel created in its channel region CH1 is maintained at 0 V and limits the injection of electrons into its floating gate. This stress effect, in and of itself, is known in the prior art as "non cumulative" because it only affects the memory cells coupled to the same control gate line as the transistor being programmed. Therefore, such stress is generally tolerated.

Thus, it has been demonstrated in the preceding that the memory cells UCP comprising a buried vertical gate SGC and a source line formed by the isolation NISO layer may be used to form a memory. It has also been demonstrated that such memory cells do not have more usage constraints than conventional UCP memory cells in read, erase, and program, particularly in terms of soft stress SST or non cumulative stress NCS.

FIGS. 14A to 14E show, by cross-sectional views, steps of a method of manufacturing vertical gates of selection transistors according to the disclosure. During a step S10, FIG. 14A, an N-doped isolation NISO layer is implanted in the wafer WF, to delimit a P-type well PW forming a substrate. The vertical sidewalls of the isolation NISO layer are not shown in the cross-sectional view of FIG. 14A, which only shows a portion of the wafer. Optionally, a P-doped layer is also implanted in the well, above the NISO layer. This layer allows adjustment of the threshold voltages of the selection transistors ST31, ST32 previously described, as well as the threshold voltage of blank cells (the threshold voltage of floating gate transistors in the absence of electrical charges trapped in their floating gates).

Figure 14A:
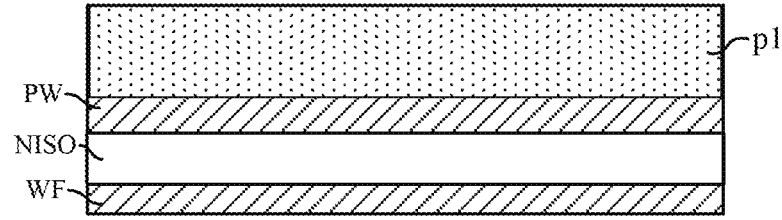
Figure 14B:
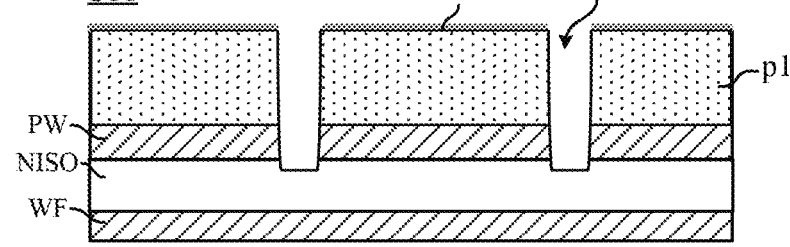
Figure 14C:
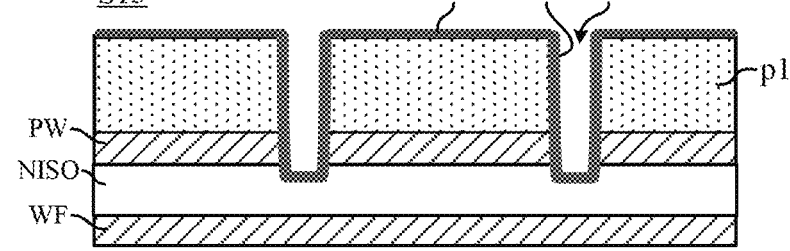
Figure 14D:
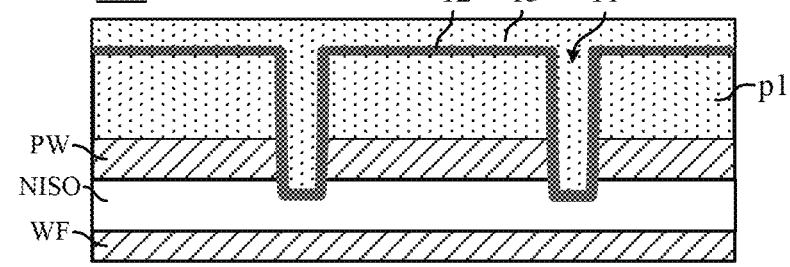

During a step S11, FIG. 14B, an etching mask 10 is deposited on the substrate PW. Parallel trenches 11 are etched in the substrate by means of the etching mask. Here, the trenches are sufficiently deep to reach the NISO layer. During a step S13, FIG. 14C, the etching mask is removed and a gate oxide layer 12 is deposited on the substrate PW and in the trenches 11. During a step S 14, FIG. 14D, a layer of polycrystalline silicon 13 is deposited on the substrate PW and in the trenches 11, above the oxide layer 12.

Figure 14E:
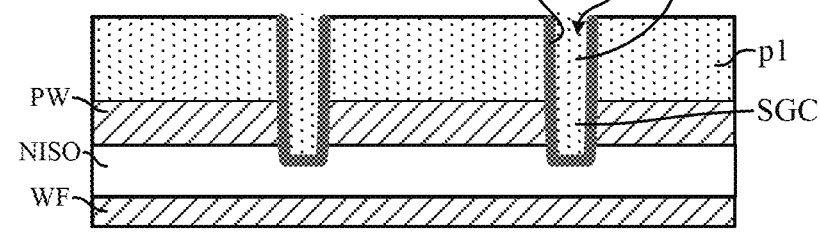

During a step S15, FIG. 14E, the layer of polycrystalline silicon 13 and the oxide layer 12 are removed from the surface of the substrate PW, so that the surface of the substrate is ready for other manufacturing steps, described later. The conductive trenches 11 in polycrystalline silicon 13 remain, isolated from the substrate by the oxide layer 12 and destined to form vertical gates SGC such as that shown in FIG. 6.

FIGS. 15A to 15F show, by cross-sectional views, a variation of the manufacturing method that has just been described. The method comprises steps S20, S21, S22, S23, S24, and S25. Step S20, FIG. 15A, is identical to step S10 previously described. Step S21, FIG. 15B, is identical to step S11 previously described but here shallower trenches 11' that do not reach the NISO layer are formed. Step S22, FIG. 15C, consists of implanting pockets n3" of N-doped semiconductor around the lower portion of the trenches 11'. These pockets will form the source regions n3" of selection transistors, previously described in relation with FIG. 7. The pockets n3" are for example implanted by passing through the inside and the bottom of the trenches, and are sufficiently deep to reach the NISO layer. Steps S23, S24, S25, FIGS. 15D, 15E, 15F, are identical to steps S13, S14, S15 previously described. At the end of these steps, conductive trenches 11' in polycrystalline silicon are obtained, isolated from the substrate by the oxide layer 12, which will form vertical gates SGC such as that shown in FIG. 7. These trenches do not reach the NISO layer but their lower portion is surrounded by pockets n3" which reach the NISO layer.

Steps of a method of manufacturing memory cells in an integrated circuit are shown in FIGS. 16A to 16E by top views. This method aims to collectively manufacture memory cells, to obtain a memory of the type described later in relation with FIGS. 25 and 26. During a step S30, FIG. 16A, conductive trenches $SGC_{i,i+1}$, $SGC_{i+2,i+3}$ are formed in the substrate PW. The conductive trenches are parallel between themselves and are isolated from the substrate. The trenches are formed according to one of the two manufacturing methods that have just been described. For the sake of simplicity, only two trenches are shown. These trenches, marked with indices (i, i+1) and (i+2, i+3), relate to the manufacturing of four pages or of four words of ranks i, i+1, i+2, and i+3.

During a step S31, FIG. 16B, shallow trench isolations STI are formed perpendicular to the conductive trenches $SGC_{i,i+1}$, $SGC_{i+2,i+3}$. The trenches are parallel between themselves and are formed by etching the semiconductor and filling the obtained trenches with oxide. They cause semiconductor strips $DS_j$, $DS_{j+1}$ to appear in the semiconductor, perpendicular to the conductive trenches $SGC_{i,i+1}$, $SGC_{i+2,i+3}$, which are destined to later form the drain and source regions of transistors.

The etching of isolation trenches STI also etches the conductive trenches $SGC_{i,i+1}$, $SGC_{i+2,i+3}$ in junction zones. To give an idea, FIGS. 17A and 17B are longitudinal and transversal cross-sectional views of isolation trenches STI along cutting axes AA' and BB' shown in FIG. 16B. The isolation trenches STI are not as deep as the conductive trenches $SGC_{i,i+1}$, $SGC_{i+2,i+3}$ and form conductive sections separated by the isolation trenches STI in the conductive trenches. Each section is destined to form a vertical gate SGC common to two selection transistors. As may be seen in FIG. 17B, these sections are electrically coupled between themselves by the sections of the conductive trenches that are not severed by the isolation trenches STI and extend beneath them. In one embodiment, not shown, the isolation trenches STI completely sever the conductive trenches and the different sections obtained are not electrically coupled.

During a step S32, FIG. 16C, conductive lines $CG_i$, $CG_{i+1}$, $CG_{i+2}$, $CG_{i+3}$ parallel to the conductive trenches $SGC_{i,i+1}$, $SGC_{i+2,i+3}$ are formed on the substrate PW, two conductive lines per conductive trench, one conductive line being placed to the left and the other being placed to the right of the conductive trench. These conductive lines are formed by the deposition of a second layer of polycrystalline silicon "poly2", then etching the poly into strips. The conductive lines are destined to form both the control gates of floating gate transistor and control gate lines CGL. Step S32 is preceded by steps of forming the floating gates, which are not shown in the drawings, performed after the step S31. These steps comprise depositing a tunnel oxide layer on the substrate, depositing a first layer of polycrystalline silicon "poly1", etching the layer "poly1" to form floating gates, then depositing a layer of oxide on the substrate, for example of the type ONO (Oxide-Nitride-Oxide), upon which the conductive lines $CG_i$ to $CG_{i+3}$ are formed.

During a step S33, FIG. 16D, N-type dopants are implanted in the semiconductor strips $DS_j$, $DS_{j+1}$, to form drain n1 and source n2 regions of floating gate transistors. The source regions n2, which extend to the right and to the left of the conductive trenches $SGC_{i,i+1}$, $SGC_{i+2,i+3}$, also form drain regions of selection transistors, in conformance with the memory cell structure shown in FIG. 6.

During a step S34, FIG. 16E, the ensemble of the substrate including the conductive lines $CG_i$, $CG_{i+1}$, $CG_{i+2}$, $CG_{i+3}$, is covered by the dielectric layer D0 cited above. This dielectric layer is not shown in the drawing so that the elements it covers may be seen. Holes are formed in the dielectric layer, and then holes are metalized to form the contacts C1, C3, C4 (Cf FIG. 8) destined to couple the elements that have just been formed to conductive metal tracks. Thus, the contacts C1 are destined to couple the drain regions n1 to bitlines. The contacts C4 are destined to couple the conductive lines $CG_i$, $CG_{i+1}$, $CG_{i+2}$, $CG_{i+3}$ to a gate control circuit. The contacts C3 are destined to couple the conductive trenches $SGC_{i,i+1}$, $SGC_{i+2,i+3}$ to a wordline driver circuit. More precisely, if the conductive trenches are completely severed by the isolation trenches STI, the contacts C3 allow them to be coupled to metal wordlines that lead to the wordline driver circuit. In this case, supplementary contacts C3' are provided to couple, to the wordlines, the sections formed by the severed conductive trenches. Inversely, if the conductive trenches are not completely severed, they may be used as wordlines. The contacts C3 allow them to be coupled to the wordline driver circuit.

The steps that have just been described are followed by steps of forming metal lines as set forth below, or interconnection lines allowing memory cells to be coupled to control elements of the integrated circuit. These steps are in and of themselves conventional and will not be described.

Figure 18A:
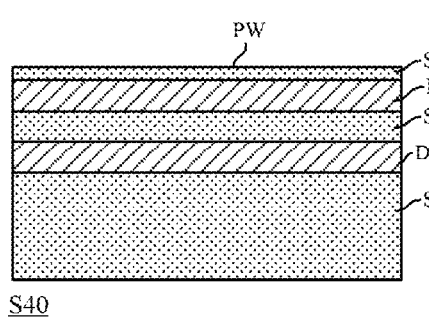
Figure 18B:
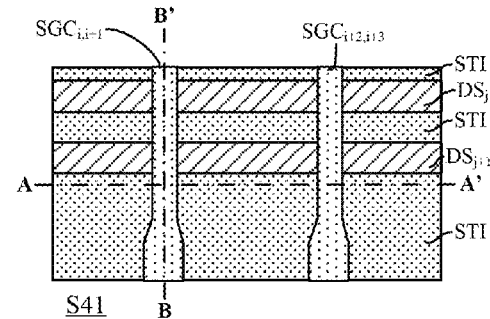
Figure 18C:
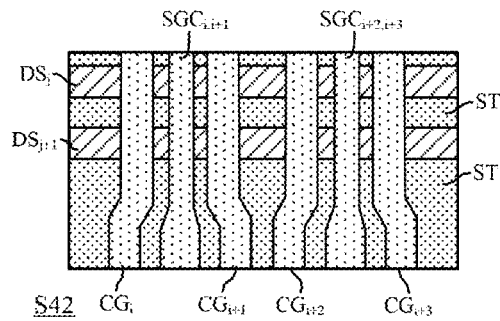
Figure 18D:
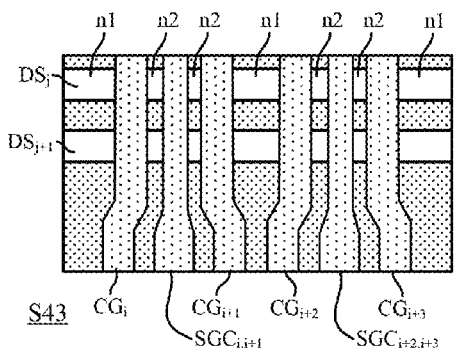
Figure 18E:
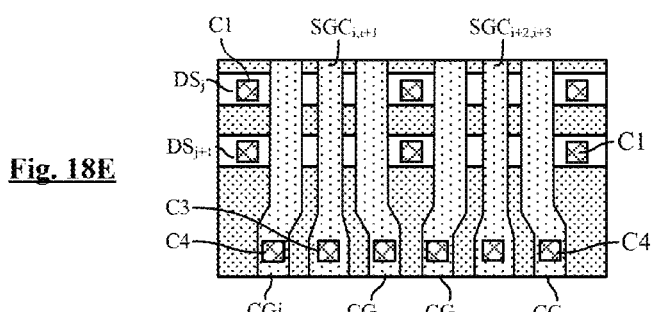
Figure 19A:
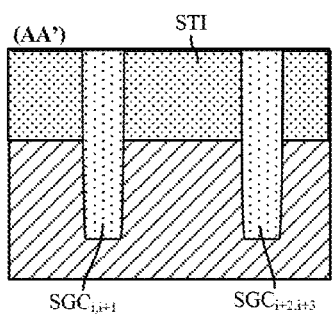
Figure 19B:
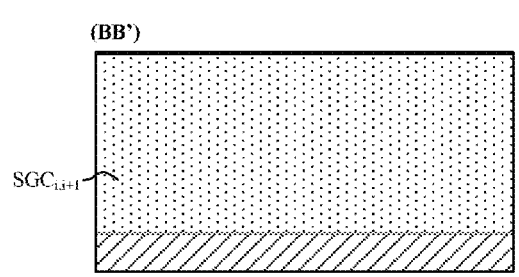

A variation of this method of manufacturing memory cells is shown in FIGS. 18A to 18E. The isolation trenches STI are formed first, during a step S40 shown in FIG. 18A. During a step S41, FIG. 18B, the conductive trenches $SGC_{i,i+1}$, $SGC_{i+2,i+3}$ are formed. Thus, here, the conductive trenches sever the isolation trenches STI. FIGS. 19A and 19B are longitudinal and transversal cross-sectional views of the conductive trenches, along axes AA' and BB' shown in FIG. 18B. The conductive trenches $SGC_{i,i+1}$, $SGC_{i+2,i+3}$ are deeper than the isolation trenches STI and sever them entirely (FIG. 19A). In an implementation variation, the isolation trenches are deeper than the conductive trenches and only partially sever them. In these two cases, the electrical continuity of the conductive trenches is complete throughout their entire depths (FIG. 19B).

The other steps of this manufacturing method are identical to those described above. FIGS. 18C, 18D, 18E differ from FIGS. 16C, 16D, 16E only in that the conductive trenches $SGC_{i,i+1}$, $SGC_{i+2,i+3}$ sever the isolation trenches STI instead of being severed by them. Thus, the method comprises a step S42, FIG. 18C, of forming conductive lines $CG_i$, $CG_{i+1}$, $CG_{i+2}$, $CG_{i+3}$ preceded by steps of forming floating gates and of oxide deposition not shown, a step S43, FIG. 18D, of forming drain n1 and source n2 regions of floating gate transistors, and a step S44, FIG. 18E, of forming contacts C1, C3, C4, the supplementary contacts C3' not being necessary here.

Figure 20:
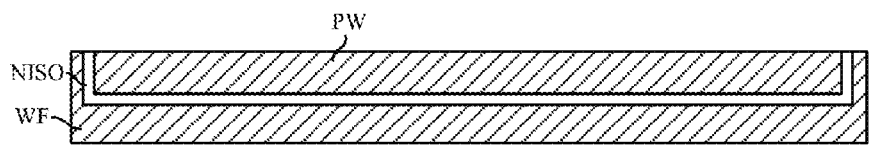
FIG. 20 is a cross-sectional view of a well receiving memory cells.
Figure 21:
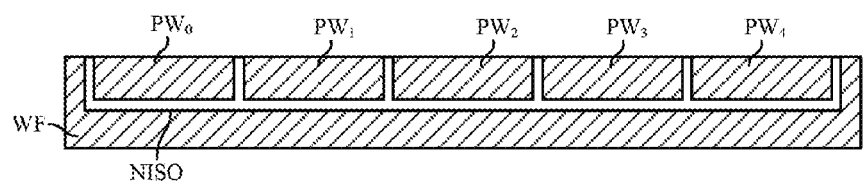
FIG. 21 is a cross-sectional view of a plurality of wells receiving memory cells.

FIG. 20 shows a step of forming the NISO layer, which delimits the well PW, in the wafer WF. The NISO layer is formed by two implantations of N-type dopants. A first implantation allows a horizontal "plate" of doped semiconductor to be formed, which delimits the bottom of the well PW. A second implantation allows the vertical sidewalls of the well PW to be formed. In an implementation variation shown in FIG. 21, the NISO layer comprises a plurality of sidewalls which delimit a plurality of wells $PW_0$, $PW_1$, $PW_2$, etc. It will be seen in what follows that certain embodiments of a memory according to the disclosure employ such a plurality of wells, each being able to be brought to an electrical potential different than the others.

Figure 22:
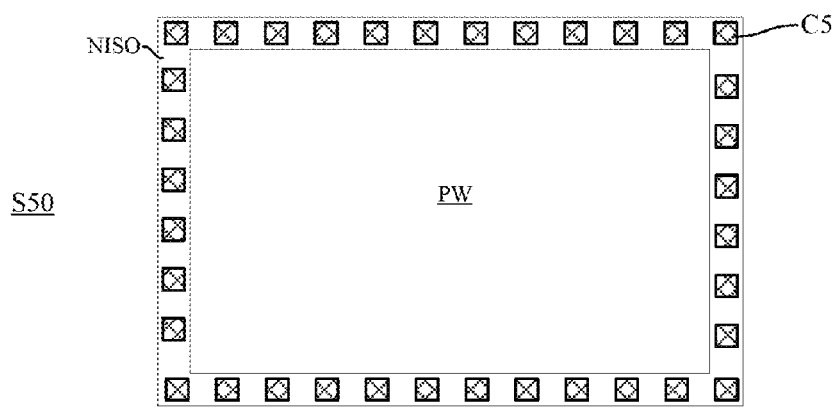
FIG. 22 is a top view of a well.

FIG. 22 shows a step of forming contacts C5 on the upper part of walls of the isolation NISO layer. This step may be done at the same time as the step of forming the contacts C1, C3, C4 shown in FIG. 16E or 18E. As the NISO layer is used as a source line, numerous contacts C5 are preferably provided all along the upper part of walls of the NISO layer, as shown in the figure, in order to decrease its electrical resistance and to favor the distribution of current lines in all directions. As indicated above, the contacts C5 allow the NISO layer to be coupled to a general source line SL formed in a metal layer, or to control elements of the source line voltage.

Figure 23:
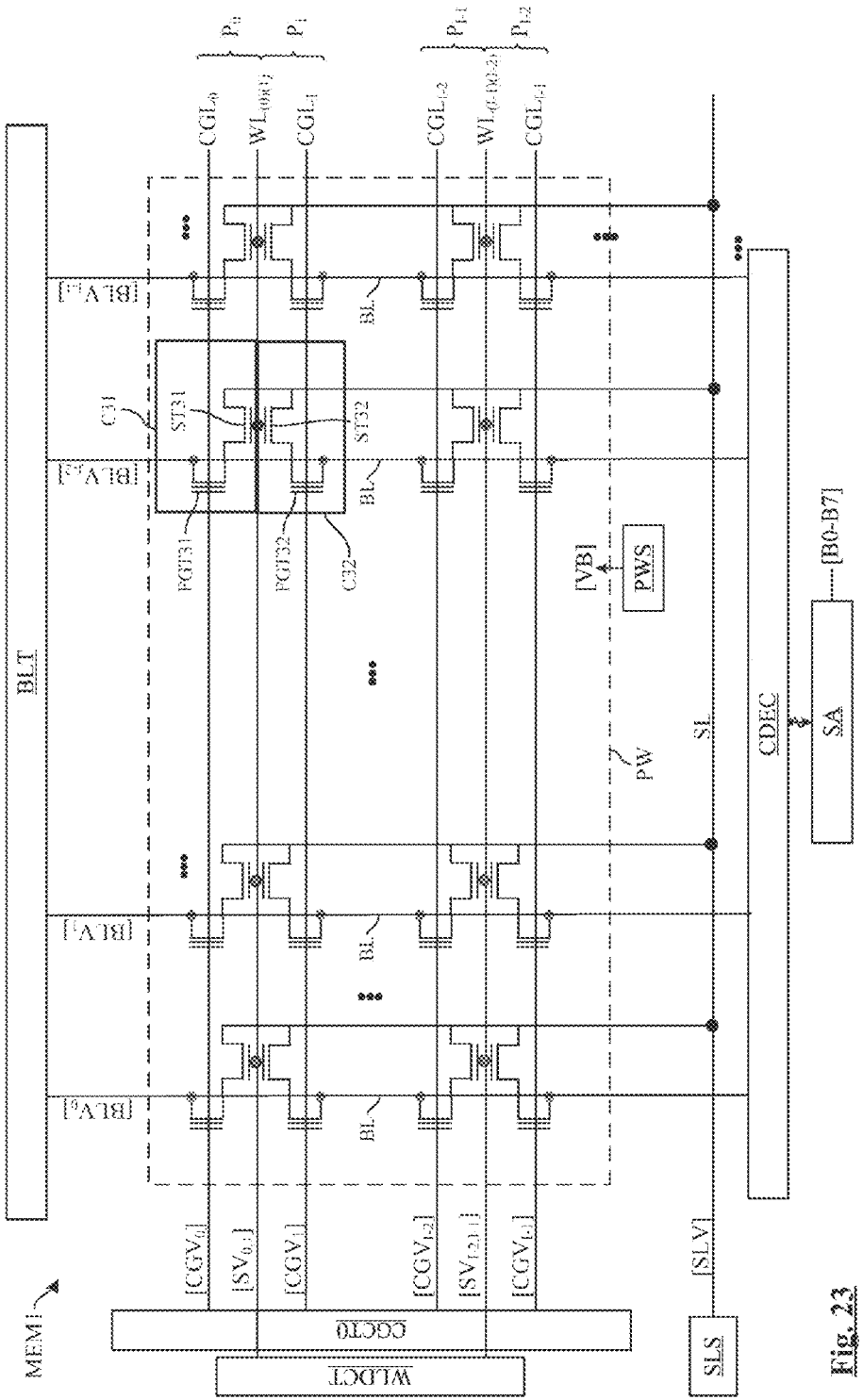
FIG. 23 is the electrical diagram of a page-erasable memory according to the disclosure.

FIG. 23 shows a page-erasable memory MEM1 comprising a memory array formed in a well PW. The memory array comprises I×J memory cells C31, C32 according to the disclosure, each memory cell C31, C32 comprising a charge accumulation transistor FGT31, FGT32 in series with a selection transistor ST31, ST32.

The memory comprises I pages P, each comprising a row of J memory cells, and a control gate line CGL. FIG. 23 shows the two first pages P0, P1 of ranks 0 and 1, and the two last pages of ranks I-2 and I-1. The memory also comprises J bitlines BL, each bitline being coupled to memory cells of the same rank J belonging to different pages. FIG. 23 shows the two first bitlines of ranks 0 and 1, and the two last bitlines of ranks J-2 and J-1. Each bitline BL is coupled to drain regions of floating gate transistors FGT of memory cells of the same rank j, whereas each control gate line CGL is coupled to control gates of transistors FGT of memory cells of the same rank i. The source regions of selection transistors are coupled to the NISO layer that surrounds the well PW.

The memory thus comprises wordlines WL that are coupled to the gates of selection transistors ST of memory cells. Each wordline WL controls the common selection gate of memory cells of two neighboring or "linked" pages, while a corresponding pair of control gate lines CGL is coupled to the control gates of transistors FGT of respective ones of the linked pages. Thus, a wordline WL of rank (0)(1) is associated with the two first pages of ranks 0 and 1 and controls the selection transistors of memory cells of these two linked pages, and paired control gate lines $CGL_0$ and $CGL_1$ are associated with respective ones of the same two linked pages, and control operation of their respective floating gate transistors. Similarly, a wordline of rank (I-2)(I-1) is associated with the two last pages of ranks I-2 and I-1 and controls the selection transistors of memory cells of these two linked pages, with paired control gate lines $CGL_{I-2}$ and $CGL_{I-1}$ controlling operation of their floating gate transistors as previously described.

The voltages applied to various control lines of the memory array are supplied by elements of the memory as a function of an address of a page to erase or of a group of memory cells to read or to program. These elements comprise:
 bitline latches BLT that apply, to the different bitlines BL, the appropriate voltages BLV during the programming of memory cells,
 a wordline driver circuit WLDCT that applies, to the different wordlines WL, the voltages SV destined to the selection transistors,
 a gate control circuit CGCTO that applies, to the different control gate lines CGL, the control gate voltages CGV of floating gate transistors,
 a source line switch SLS that applies the source line voltage SLV to the NISO layer,
 a well switch PWS that applies the substrate voltage VB to the well PW,
 sense amplifiers SA that apply, to the different bitlines BL, the appropriate voltages BLV during the read of memory cells, and supply a binary word read in the memory, for example a word of 8 bits B0-B7, and
 a column decoder CDEC that couples the sense amplifiers SA to the different bitlines.

The voltages supplied by these various elements are described by the tables RD4, ER2, PG2, and PG2'. In particular, the bitline latches BLT supply the "biasing voltage during the programming", or the "non-programming voltage" appearing in tables PG2 and PG2'. The sense amplifiers SA supply the "read biasing voltage" appearing in table RD4.

It will clearly appear to the skilled person that this memory structure comprising a wordline WL common to two rows of neighboring memory cells (for example pages $P_0$, $P_1$), in which the common wordline is coupled to gates of selection transistors ST31 of the first row and to gates of selection transistors ST32 of the second row, may be modified to receive memory cells C21, C22 of the type described above in relation with FIG. 5, in which the selection transistors ST21, ST22 do not comprise a common gate but share the same wordline WL.

Figure 24:
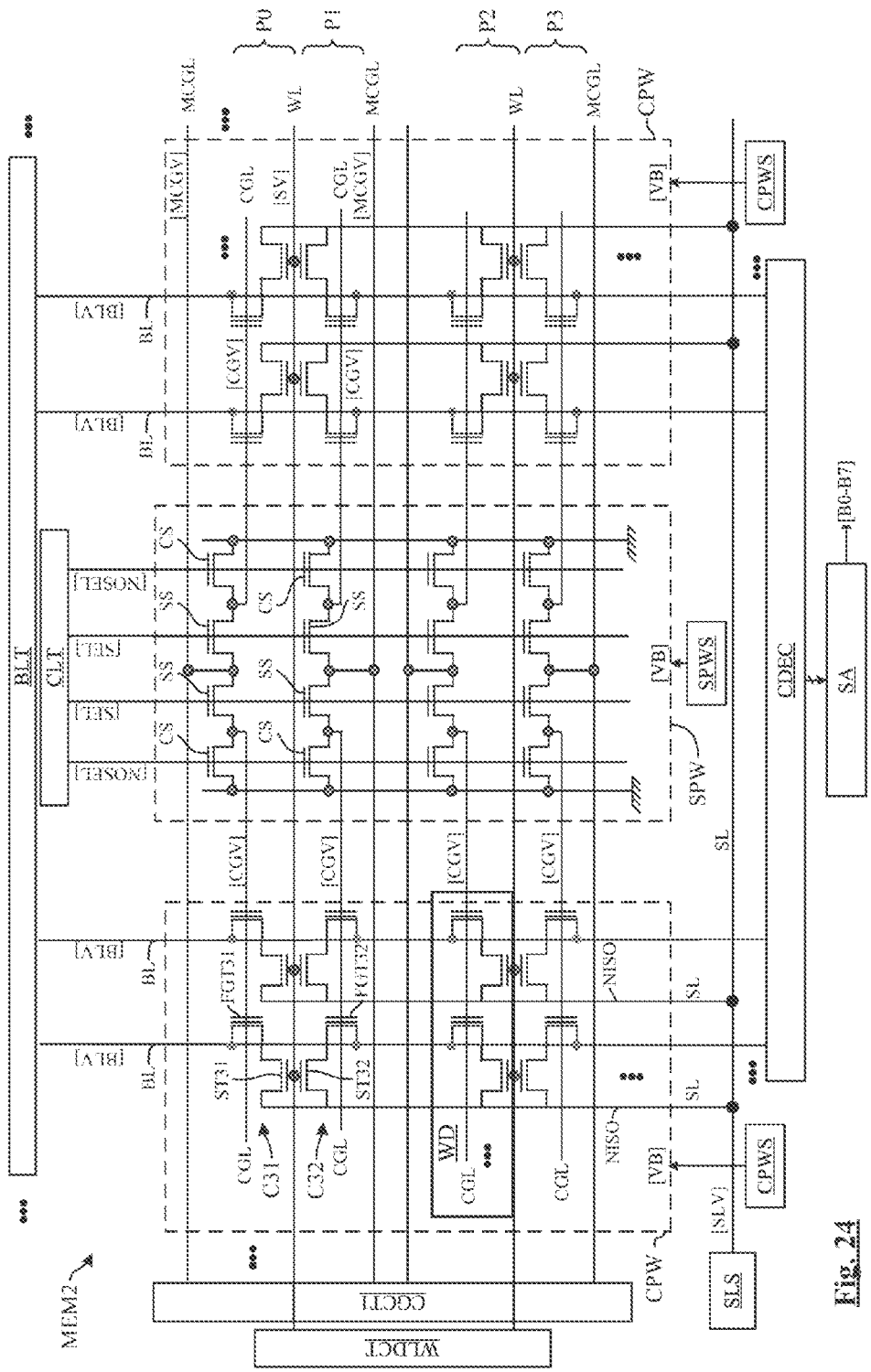
FIG. 24 is the electrical diagram of a word-erasable memory according to the disclosure.

FIG. 24 shows a word-erasable memory MEM2 comprising a memory array formed in a plurality of wells CPW. Each well CPW comprises memory cells C31, C32 according to the disclosure, each comprising a charge accumulation transistor FGT31, FGT32 in series with a selection transistor ST31, ST32. The memory also comprises wells SPW receiving control switches. The structure of the memory array is of the type CPW-SPW-CPW/CPW-SPW-CPW/CPW-SPW-CPW/..., a control well SPW being associated with two wells CPW of memory cells and arranged between them. For reasons of clarity, FIG. 24 only shows one well SPW and two wells CPW. In a variation, the structure of the memory array could be of the type CPW-SPW/CPW-SPW/CPW-SPW/..., by providing one control well SPW per cell well CPW.

The structure of each well CPW is similar to the structure of the memory array of the page-erasable memory MEM1 of FIG. 23, but the pages are replaced by words WD, that is to say, a group of memory cells containing a number of memory cells less than the number of memory cells of a page, for example 8 memory cells. A page of the memory MEM2 is thus comprised of a plurality of words WD, one of which is encircled in FIG. 24. FIG. 24 shows the first four pages $P_0$, $P_1$, $P_2$, $P_3$ of the memory array.

More particularly, each page comprises:
 a plurality of words WD, distributed amongst the different wells CPW,
 control gate lines CGL, each attributed to a word WD and paired with a corresponding control gate line CGL attributed to a word WD of a neighboring linked page,
 a main control gate line MCGL that traverses the entire memory array and supplies a main control gate voltage MCGV to the different control gate lines CGL of that page, paired with a corresponding main control gate line MCGL of the neighboring page, and
 a wordline WL, shared with the neighboring, linked page, that traverses the entire memory array.

Each well CPW comprises a word WD of each page. Each memory cell of each word is coupled to a bitline BL, to the corresponding control gate line CGL common to all the memory cells of the word, to a wordline common to all the memory cells of the word as well as the memory cells of the neighboring word, and to the layer NISO of the well. By means of the control well SPW, the control gate line CGL of the word is coupled to the main control gate line MCGL of the page to which the word belongs.

The control well SPW comprises:
 a first vertical row of switch transistors CS controlled by a common signal NOSEL, provided to control the lines CGL of the cell wells located to the left of the control well,
 a first vertical row of switch transistors SS controlled by a common signal SEL, also provided to control the lines CGL of the cell wells located to the left of the control well,
 a second vertical row of switch transistors CS controlled by a common signal NOSEL, provided to control the lines CGL of the cell wells located to the right of the control well, and
 a second vertical row of switch transistors SS controlled by a common signal SEL, also provided to control the lines CGL of the cell wells located to the right of the control well.

More precisely, each switch CS couples a line CGL to ground, and each switch SS couples a line CGL to the main control gate line MCGL of the page to which the considered word belongs. The combination of signals SEL and NOSEL thus allow the line CGL to be coupled to ground or to the main control gate line MCGL.

The voltages applied to these various lines of the memory array are supplied by memory elements as a function of a selection address of a word to erase, read, or program. These elements comprise:
 bitline latches BLT, which apply, during the programming of memory cells, the appropriate voltages BLV to the different bitlines BL, a wordline driver circuit WLDCT, which applies the selection voltages SV destined to the selection transistors to the different wordlines WL, a control gate circuit CGCT1, which applies control gate voltages CGV to the different main control gate lines MCGL, column latches CLT, which supply the signals SEL and NOSEL to each vertical row of switches CS, SS.

a source line switch SLS that applies the source line voltage SLV to the NISO layer of all the wells, a well switch CPWS per well CPW, which applies the substrate voltage VB to the well CPW, a well switch SPWS per well SPW, which applies the substrate voltage VB to the well SPW, sense amplifiers SA, which apply, during the read of memory cells, the appropriate voltages BLV to the different bitlines BL, and supply a binary word read in the memory, for example a word of 8 bits B0-B7, and a column decoder CDEC, which couples the sense amplifiers to the different bitlines.

Figure 25:
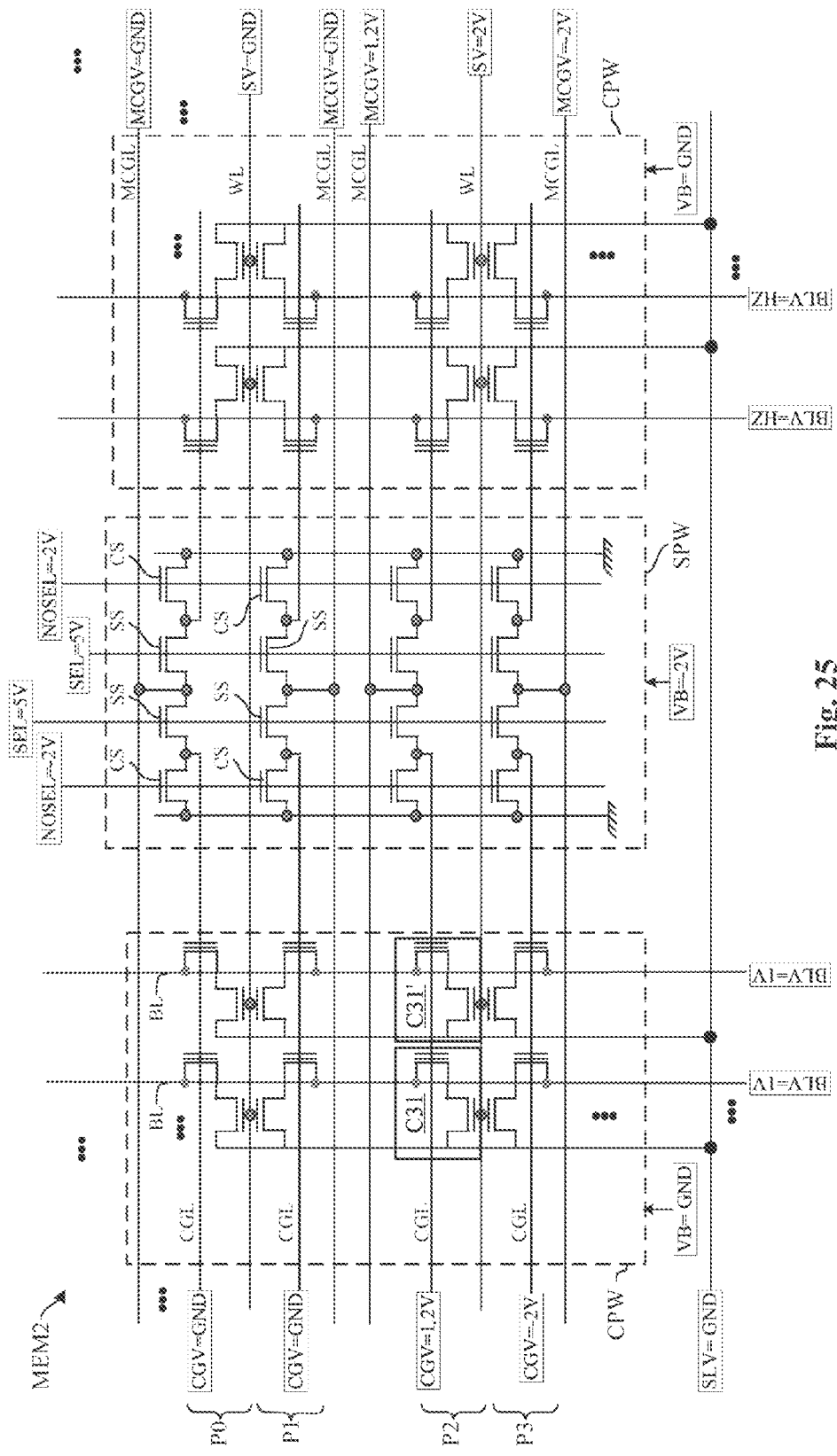
FIGS. 25, 26, and 27 show voltages applied to the memory of FIG. 24 during read, erase, and programming phases of memory cells.

The memory array thus arranged allows the read, erase, and program methods previously described to be applied to the memory cells. In relation with FIG. 25, table RD5 in Annex 1 describes voltage values applied to the memory array during the read of memory cells. FIG. 25 shows the distribution of these voltage values during the read of the two memory cells C31, C31', encircled in the drawing.

Figure 26:
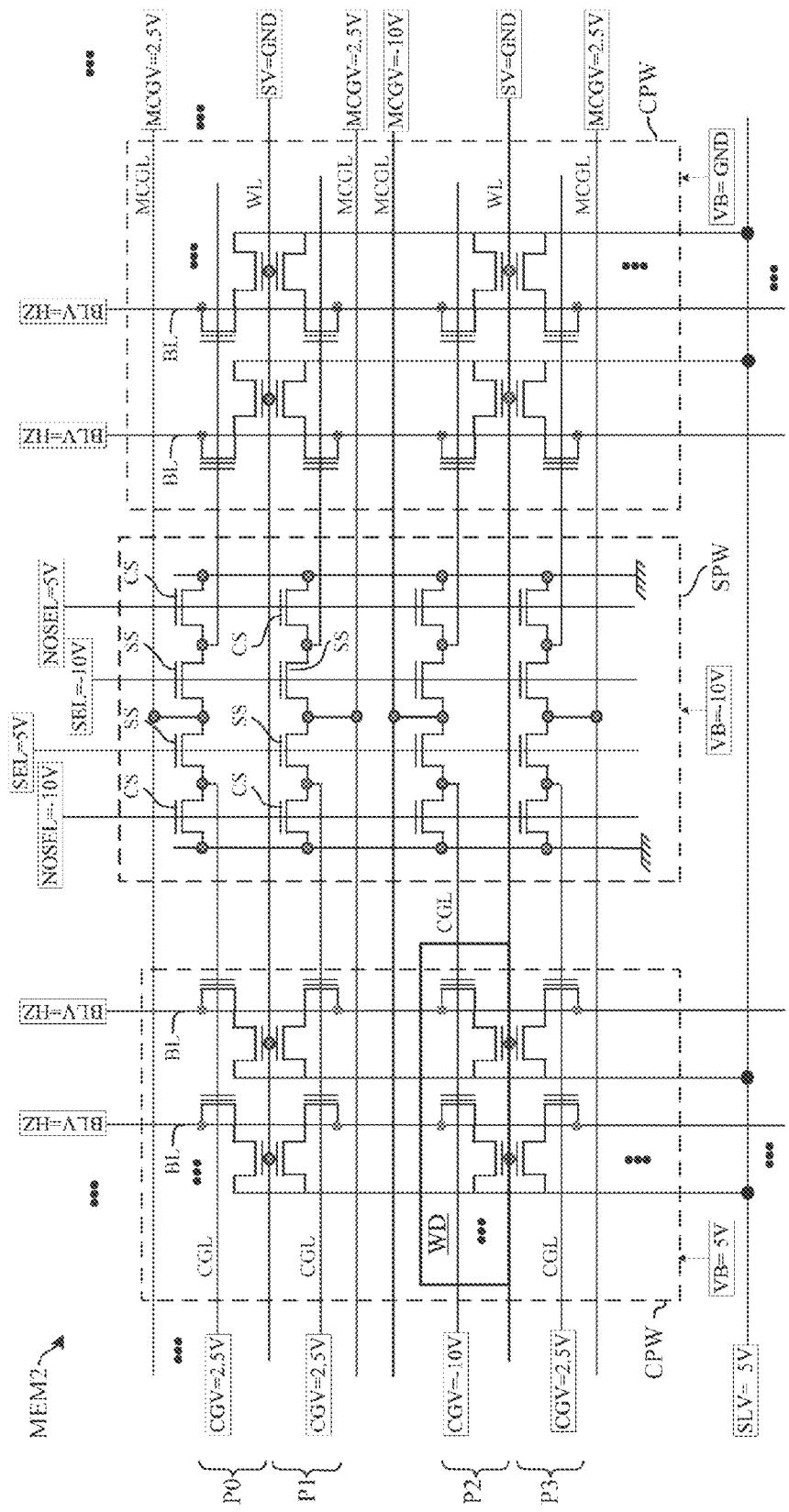

In relation with FIG. 26, table ER3 in Annex 1 describes voltage values applied to the memory array during the erasure of a word. FIG. 26 shows the distribution of these voltage values during the erasure of a word WD encircled in the drawing.

Figure 27:
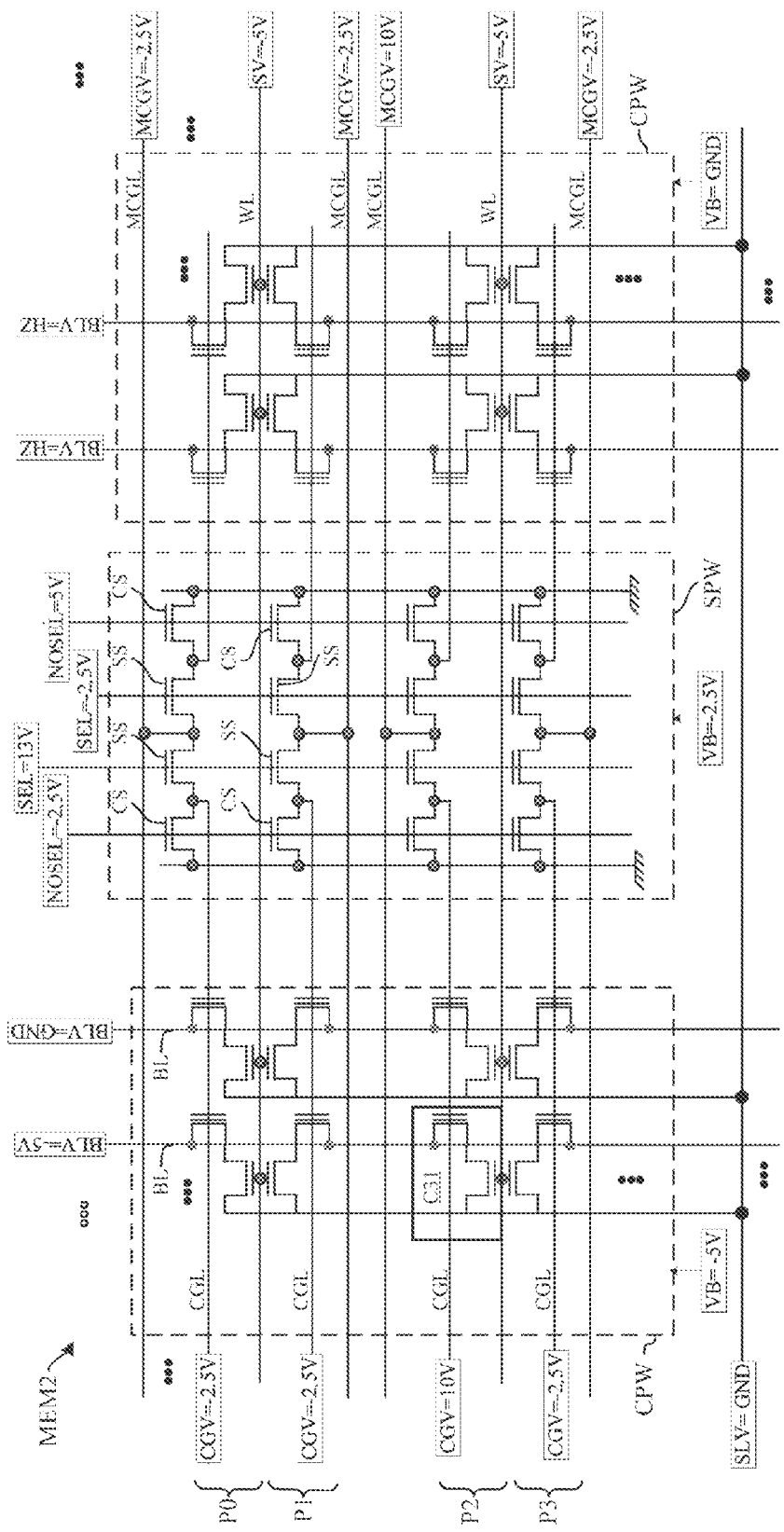

In relation with FIG. 27, table PG3 in Annex 1 describes examples of voltage values applied to the memory array during the programming of a memory cell. FIG. 27 shows the distribution of these voltage values during the programming of a memory cell C31 encircled in the drawing.

It can be seen in the tables ER3, PG3 that, during the erasure of a word, a main control gate line that is not selected but is paired with the selected main control gate line (i.e., that is associated with a page linked to the selected page) has a voltage different than that applied to a non-selected main control gate line that is not paired with the selected main control gate line. Similarly, during the read of the memory cells, a control gate line that is not selected but is paired with the selected control gate line has a voltage different than that applied to a non-selected control gate line that is not paired with the selected control gate line.

It will be understood by the skilled person that this memory structure comprising a wordline WL common to two rows of neighboring memory cells forming words WD, may be modified to receive memory cells C21, C22 of the type described above in relation with FIG. 5, of which the selection transistors ST21, ST22 do not comprise a common gate but share the same wordline WL.

Figure 28:
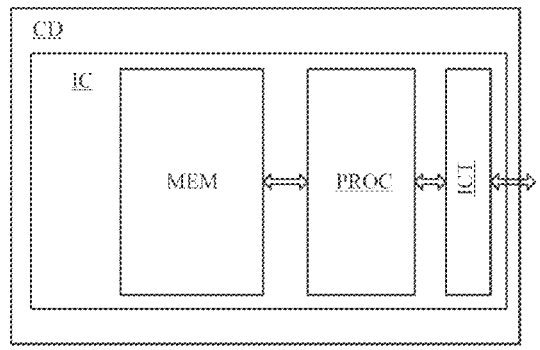
FIG. 28 shows an electronic device comprising a memory according to the disclosure.

FIG. 28 shows an application example of a memory MEM according to the disclosure (MEM1 or MEM2). The memory MEM is arranged in an integrated circuit IC equipped with a processor and a communication interface circuit ICT, for example an integrated circuit for a chip card. The integrated circuit is mounted on a support CD, for example a plastic card. The memory MEM allows, for an identical memory capacity, to reduce the size and the cost price of integrated circuits, or, for an identical surface area, to increase the storage capacity of the memory.

In a variation of the previously-described manufacturing method, memory cells are formed in mini wells that are electrically isolated from each other by the conductive trenches $SGC_{i,i+1}$, $SGC_{i+2,i+3}$ and the isolation trenches STI. To obtain this feature, during the previously described step of forming the isolation trenches STI (Cf. FIG. 16B or FIG. 18A), it is ensured that the depth of the isolation trenches STI is sufficient to reach the NISO layer and that the depth of the conductive trenches $SGC_{i,i+1}$, $SGC_{i+2,i+3}$ is equally sufficient to reach the NISO layer (Cf. FIGS. 14A to 14E).

Figures 29A, 29B:
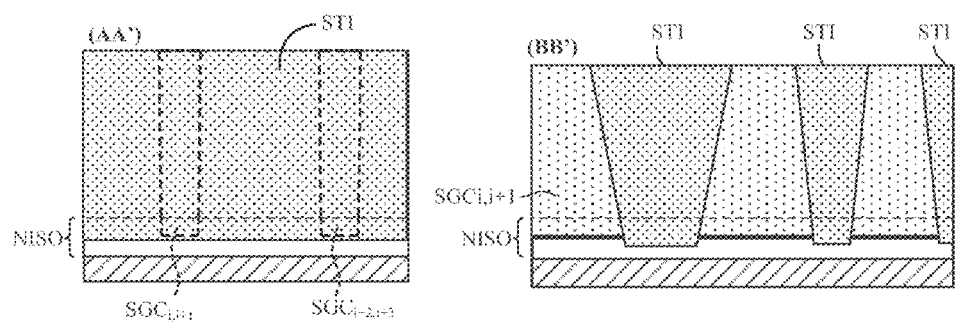
FIGS. 29A, 29B are cross-sectional views of a manufacturing step shown in FIG. 16B, forming a variation of steps shown in FIGS. 17A, 17B.

This variation of the manufacturing method is shown in FIGS. 29A, 29B, which replace FIGS. 17A, 17B previously described in relation with the manufacturing method shown in FIGS. 16A to 16E. FIGS. 29A and 29B are longitudinal and transversal cross-sectional views of the isolation trenches STI along cutting axes AA' and BB' shown in FIG. 16B. The isolation trenches STI may be substantially deeper or shallower than the conductive trenches $SGC_{i,i+1}$, $SGC_{i+2,i+3}$, provided that the two trenches reach the NISO layer. One or the other or both may extend deeper than the NISO layer. If the isolation trenches are substantially deeper than the conductive trenches, as shown here, they will cause conductive portions to appear in the conductive trenches. Each portion is destined to form a vertical gate SGC common to two selection transistors. In the opposite case, the conductive trenches conserve a lower part not severed by the isolation trenches, electrically coupling their different portions (not shown).

This variation may also be applied to the manufacturing method previously described in relation with FIGS. 18A to 18E, in which the isolation trenches STI are severed by the conductive trenches $SGC_{i,i+1}$, $SGC_{i+2,i+3}$.

The fact that the isolation trenches and the conductive trenches reach the NISO layer causes a plurality of mini wells to appear in the well PW. The mini wells are isolated in the three dimensions from each other by:

the isolation trenches STI, the conductive trenches $SGC_{i,i+1}$, $SGC_{i+2,i+3}$, which are electrically isolated from the substrate by the isolating layer 12 that surrounds them (Cf FIG. 14E for example), and the NISO layer itself.

Figure 30:
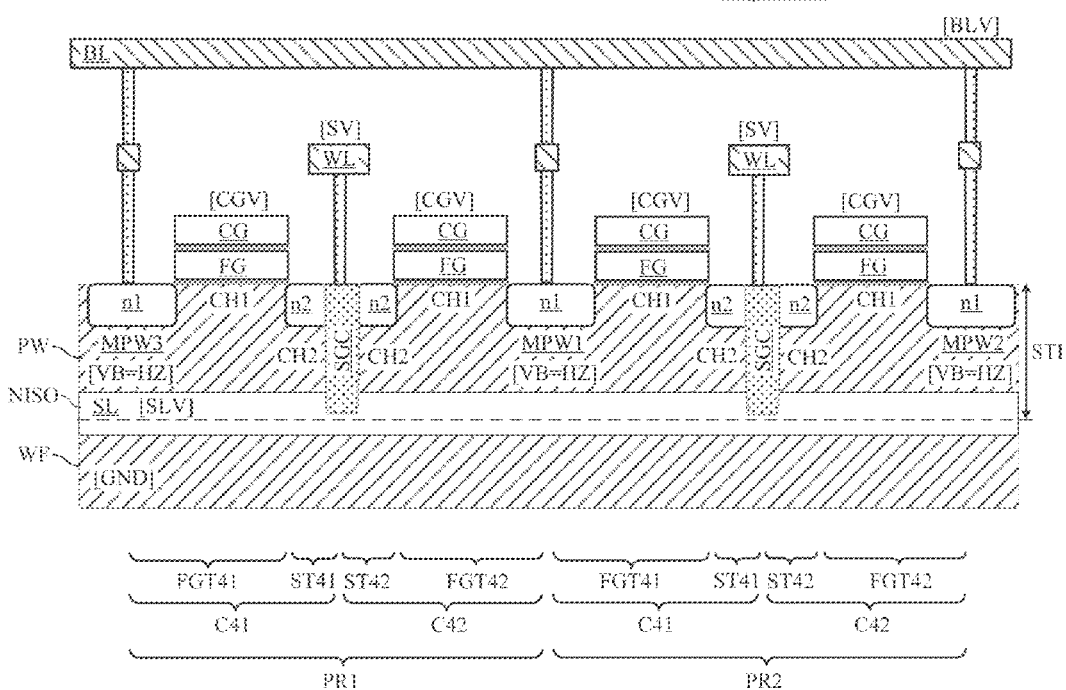
FIG. 30 is a schematic cross-sectional view of a third embodiment of a pair of memory cells according to the disclosure, presenting the feature shown in FIGS. 29A, 29B.

FIG. 30 is a cross-sectional view showing a third embodiment of memory cells according to the disclosure, formed according to the manufacturing method variation that has just been described. More particularly, FIG. 30 shows two pairs PR1, PR2 of memory cells coupled to the same bitline BL. Each pair PR1, PR2 comprises two memory cells C41, C42 according to the disclosure (the same references being attributed to the memory cells of each pair). Each memory cell C41, C42 comprises a floating gate transistor FGT41, FGT42 and a selection transistor ST41, ST42. The transistors FGT41, FGT42 are of the same structure as the transistors FGT31, FGT31 previously described, each comprising a horizontal channel region CH1 extending under its floating gate FG, between the drain n1 and source n2 regions. The selection transistors ST41, ST42 are of the same structure as the selection transistors ST31, ST32 previously described, each comprising a common buried vertical gate SGC that reaches the NISO layer, the transistor ST41 having a vertical channel region CH2 opposite the left vertical wall of the gate SGC, and the transistor ST42 having a vertical channel region CH2 opposite the right vertical wall of the gate SGC. Moreover, it is assumed in this implementation example that the common gate SGC of the selection transistors of each pair PR1, PR2 is completely severed at its extremities by the isolation trenches STI, and is coupled by means of contacts to a wordline WL formed in a first metal layer ("metal1"). The bitline BL is in this case formed in a second metal layer ("metal2") and the drain regions n1 of the transistors FGT41, FGT42 of each pair of memory cells are coupled to the bitline BL by means of contacts and of conductive vias of a type already described.

Each pair of memory cells C41, C42 differs from the pair of memory cells C31, C32 of FIG. 11 in that the isolation trenches STI extending in front of and behind the memory cells (that is, in front of and behind the cutting plane of FIG. 30) reach the NISO layer, as shown by a horizontal dotted line showing the depth of the isolation trenches STI. As a result:

the second memory cell C42 of the first pair PR1 and the first memory cell C41 of the second pair PR2 are found in a first mini well MPW1, the second memory cell C42 of the second pair PR2 is found in a second mini well MPW2, which also receives the first memory cell C41 of a pair of memory cells extending to the right of the pair PR2, not shown in FIG. 30, and the first memory cell C41 of the first pair PR1 is found in a third mini well MPW3, which also receives the second memory cell C42 of a pair of memory cells extending to the left of the pair PR2, not shown in FIG. 30.

With the exception of the electrical potential VB of the mini wells, the voltages applied to the memory cells C41, C42 are identical to those applied to the memory cells described by the table REF3:

BLV is the voltage applied to the bitline BL and thus applied to the drain regions n1 of transistors FGT41, FGT42 of each of the pairs PR1, PR2, CGV is the voltage applied to the control gate of a transistor FGT41, FGT42 by means of a control gate line (not shown), SV is the selection voltage applied to the common gate SGC of the transistors ST41, ST42 of a same pair PR1, PR2 by means of the corresponding wordline WL, SLV is the voltage applied to the isolation NISO layer as a source line SL.

In this embodiment of memory cells, the electrical potential VB of mini wells is not "applied" but rather induced by means of the bitline BL, during erasing and programming. The electrical potential VB of each mini well is, by default, the floating potential (HZ), but may vary as a function of the voltage applied to the bitline. The mini wells are isolated from each other, so each mini well may thus have a floating potential VB different than its neighboring mini wells. An embodiment of a method of reading, erasing, and programming memory cells is based on this technical effect to control the potential VB of the mini wells, as will be described in what follows.

Figure 31:
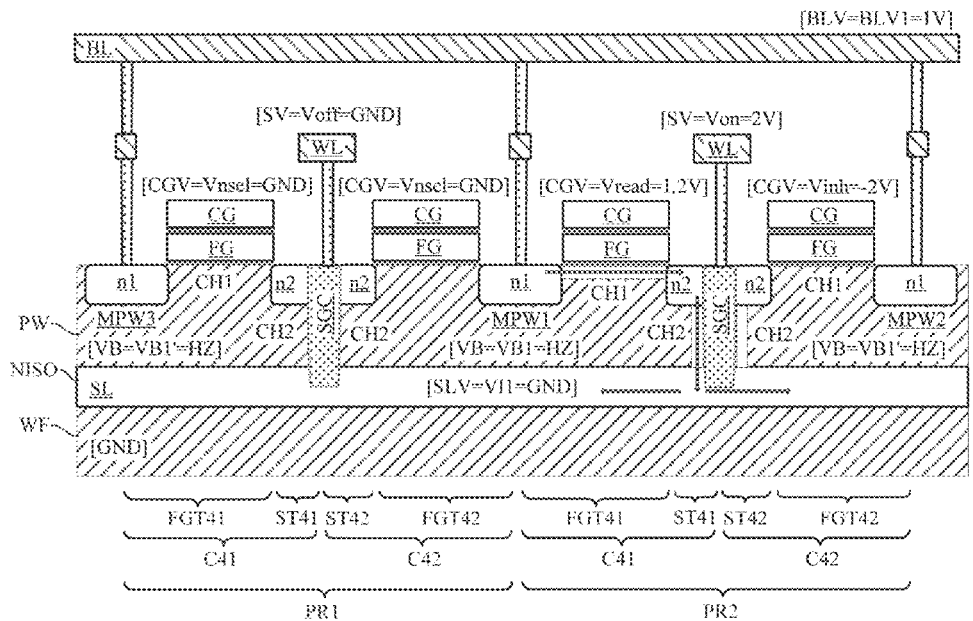
FIG. 31 shows a read process, according to the disclosure, of a memory cell of the pair of memory cells of FIG. 30.

A method of reading the memory cell C41 of the second pair PR2 of memory cells is shown in FIG. 31 and described by the table RD6 in Annex 2. This method differs from that previously described in relation with FIG. 9 in that the mini wells MPW1, MPW2, MPW3 are not coupled to ground and are at a potential VB1, VB1' that is floating (HZ). Arrows show a current traversing the channel region CH1 of the transistor FGT41 of the cell C41 of the pair PR2, and the vertical channel region CH2 of the corresponding transistor ST41. A conductive channel also appears in the vertical channel region CH2 of transistor ST42 having the same gate SGC, under the effect of the voltage SV=Von applied to the common gate SGC, but the associated floating gate transistor FGT42 remains blocked under the effect of the inhibition voltage Vinh.

Figure 32:
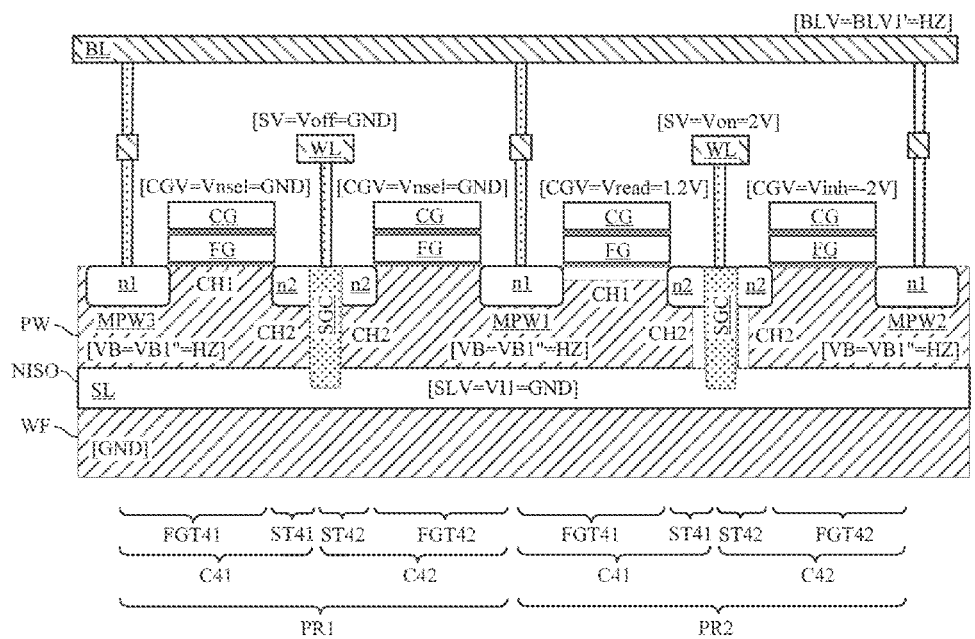
FIG. 32 shows the voltages to which the pair of memory cells of FIG. 30 are subjected to during the read of a neighboring memory cell.

In relation with FIG. 32, table RD6 also describes voltage values applied to the memory cells during the read of a memory cell coupled to the same control gate line and to the same wordline WL as that of the memory cell C41 of the second pair PR2, but coupled to a bitline other than the bitline BL shown in the figure. These memory cells are in front of or behind the cutting plane of the memory cells C41, C42 of FIG. 36. The memory cells C41, C42 of the pair PR2 receive the same voltages as the memory cell being read, except for the bitline voltage BLV, which is brought to a non-read voltage BLV1', here the floating potential HZ. Thus, no current traverses the memory cell C41 of the pair PR2 even though its transistors FGT41 and ST41 each have a conductive channel in its channel region CH1, CH2.

Figure 33:
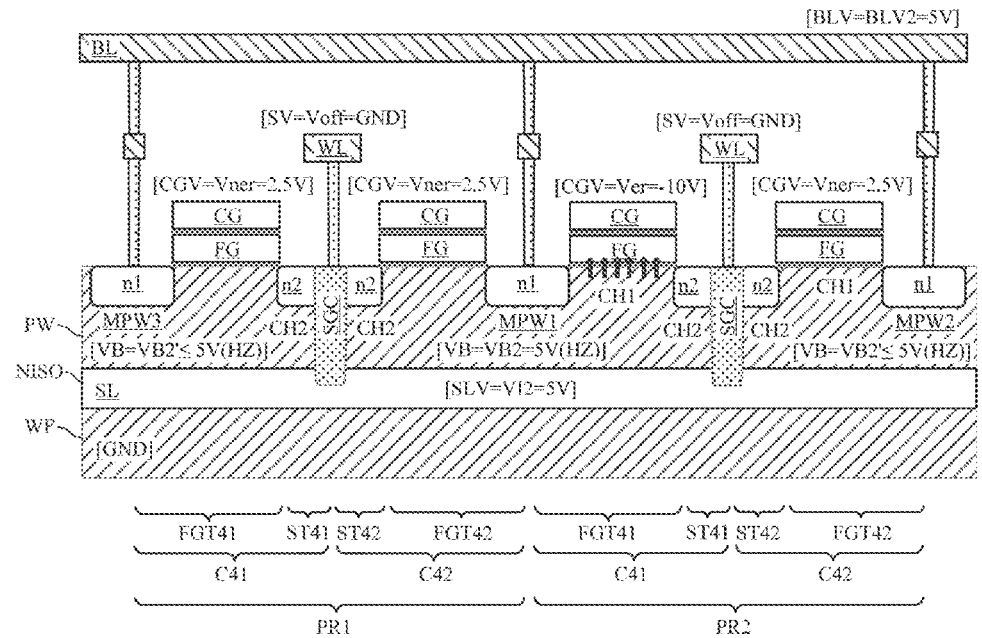
FIG. 33 shows an erase process, according to the disclosure, of a memory cell of the pair of memory cells of FIG. 30.

In relation with FIG. 33, table ER4 in Annex 2 describes voltage values applied to the memory cells during erasure of the memory cell C41 of the pair PR2 of memory cells. Contrary to the previously described erase method, bitline BL receives here a positive and non-zero voltage BLV2, for example 5V, and the potential VB2 of the corresponding mini well MPW1 is floating. Simultaneously, the control gate CG of the transistor FGT41 of the memory cell C41 receives the negative erase voltage Ver, for example −10 V. The PN junction between the mini well MPW1 and the drain region n1 of the transistor FGT41 is in a blocked state due to the positive biasing applied to the drain region n1 (here 5V) by means of the bitline BL. Nevertheless, the negative voltage Ver induces a high electrical field, causing a non-negligible inverse leakage current to appear in a zone of the PN junction, close to the floating gate FG of the transistor FGT41. This current may also be called "band-to-band current". This leakage currant causes the floating potential VB of the mini well MPW1 to rapidly increase, until it reaches or is close to the potential of the drain region n1 imposed by the bitline BL, here 5 V. In these conditions, and as shown in FIG. 33 by arrows, an erase electrical field appears between the mini well MPW1 and the floating gate FG of the transistor FGT41. This erase electrical field extracts electrons from the floating gate by tunnel effect (the Fowler Nordheim effect). Moreover, the transistor FGT42 found in the same mini well MPW1, that is, that of the pair PR1 (and not, as previously, that of the same pair), is subjected to a soft stress effect SST due to the potential difference between the mini well MPW1 and its control gate, here equal to 2.5 V. This soft stress effect is insufficient to extract significant electrical charges from the floating gate of this transistor.

During this erase process, the potential VB2' of the mini wells MPW2, MPW3 that do not contain a memory cell selected for erasure, also tends towards the voltage BLV2 but in a slower manner due to a much weaker band-to-band current, the transistors FGT41, FGT42 of these memory cells receiving the non-erase positive voltage Vner, here 2.5 V.

Figure 34:
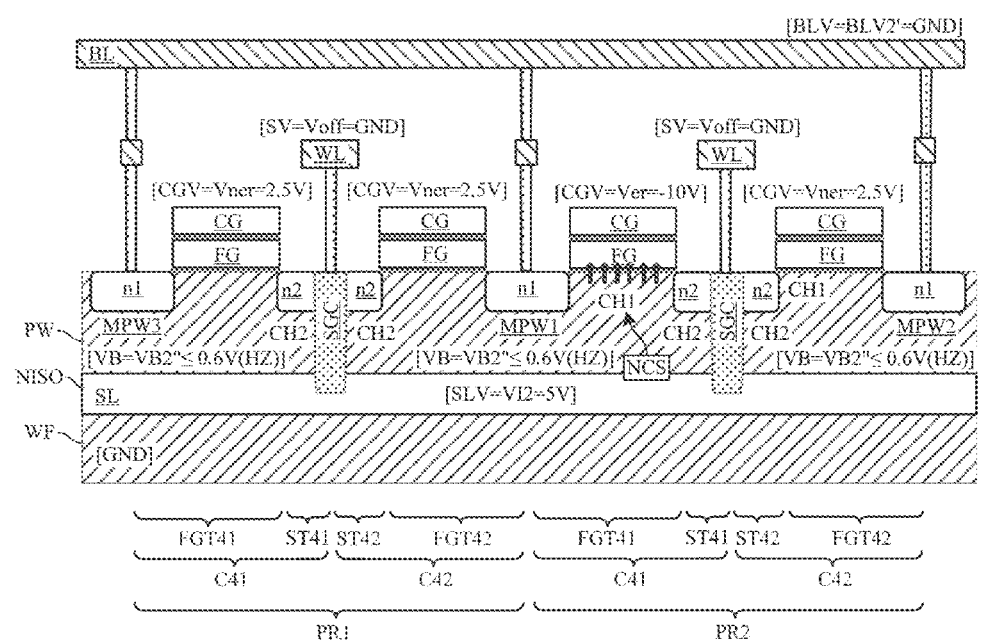
FIG. 34 shows the voltages to which the pair of memory cells of FIG. 30 are subjected to during the erasure of a neighboring memory cell.

In relation with FIG. 34, table ER4 also describes voltage values applied to the memory cells during the erase of a memory cell coupled to the same control gate line and to the same wordline WL as that of the memory cell C41 of the pair PR2, but coupled to a bitline other than the bitline BL shown in the figure. The memory cells C41, C42 receive the same voltages as the memory cells being erased, except for the bitline voltage BLV that is brought to a non-erase voltage BLV2', here the ground potential GND. The voltage V12 applied to the NISO layer, for example 5V, may cause the floating potential VB2" of the mini wells MPW1, MPW2, MPW3 to increase to 5 V by inverse junction leakage, but conducting junctions between the mini wells and the grounded drain regions limit this voltage increase to the voltage value of a conducting diode, for example 0.6 V. As the transistor FGT41 of the memory cell C41 of the pair PR2 receives the erase voltage Ver on its control gate CG, it is subjected to a low-intensity non-cumulative stress, due to potential difference on the order of 10.6 V.

Figure 35:
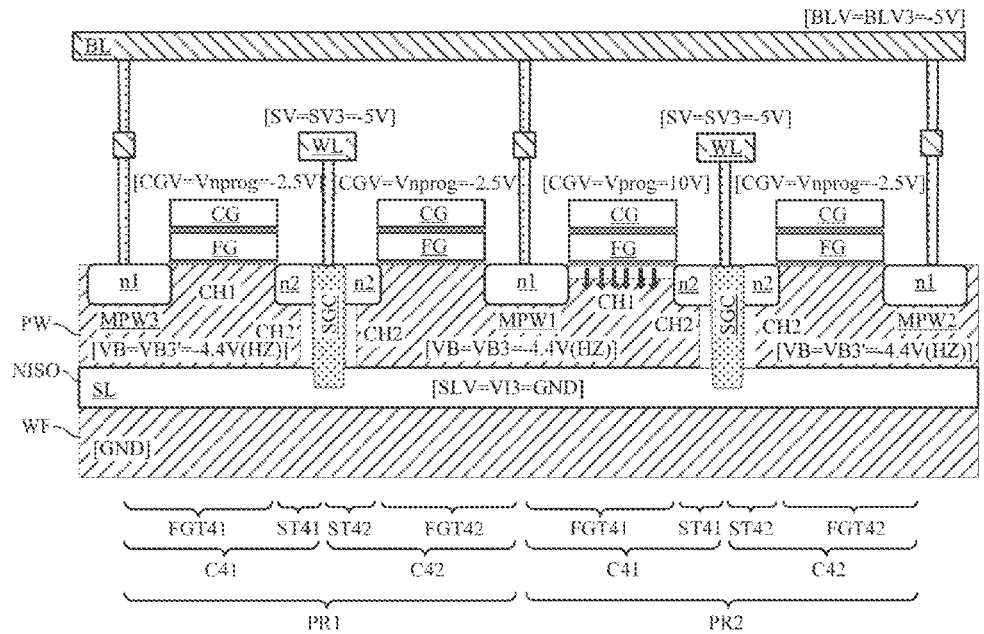
FIG. 35 shows a programming process, according to the disclosure, of a memory cell of the pair of memory cells of FIG. 30.

In relation with FIG. 35, table PG4 in Annex 2 describes voltage values applied to the memory cells during the programming of the memory cell C41 of the pair PR2 of memory cells. The voltages applied to the memory cell are identical to those previously described in relation with FIG. 12 and the table PG2, with the difference that the mini wells are at a floating potential VB3, VB3'. Under the effect of the negative voltage BLV3, here −5 V, applied to the bitline, the PN junctions between the drain regions n1 of transistors FGT41, FGT42, and the mini wells are conducting and cause the floating potential VB3, VB3' to increase until it reaches a value equal to the voltage BLV3 minus the conducting diode voltage, here 0.6 V. Thus, the potentials VB3, VB3' stabilize around −4.4 V. In these conditions, and as shown in FIG. 33 by arrows, a program electrical field appears between the mini well MPW1 and the floating gate FG of the transistor FGT41. This electrical field causes a conductive channel to appear in the channel region CH1 of the transistor and causes the injection of electrons into its floating gate by tunnel effect (the Fowler Nordheim effect).

Figure 36:
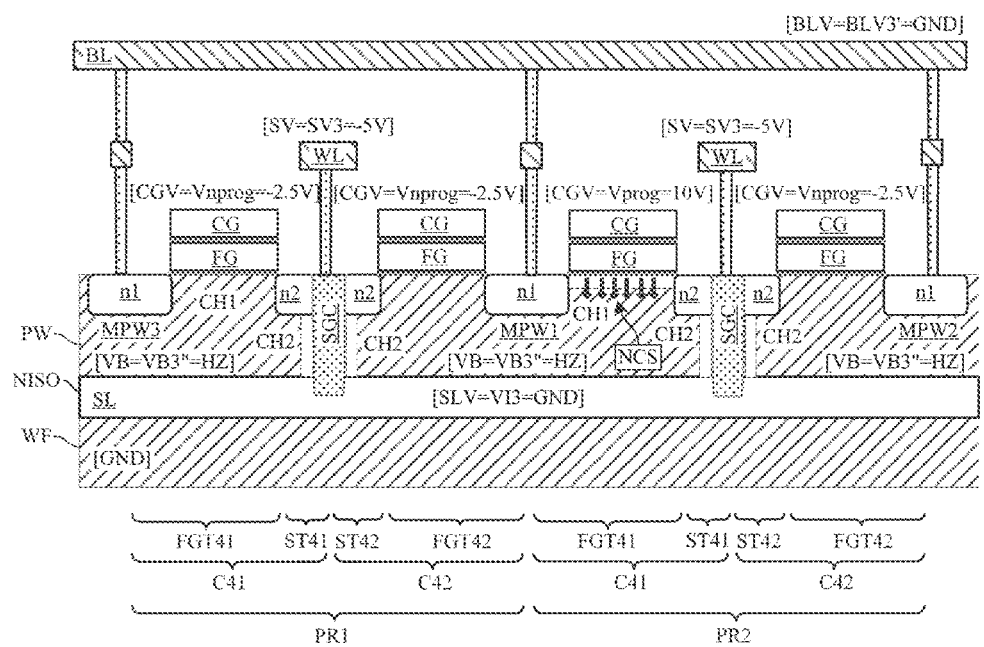
FIG. 36 shows the voltages to which the pair of memory cells of FIG. 30 are subjected to during the programming of a neighboring memory cell.

In relation with FIG. 36, table PG4 in Annex 2 also describes voltage values applied to the memory cells during the programming of a memory cell coupled to the same control gate line and to the same wordline WL as the memory cell C41 of the pair PR2, but coupled to a bitline other than the bitline BL shown in the figure. The bitline BL is thus brought to a non-selection voltage BLV3', here the ground potential GND. In these conditions, the floating potential VB3'' of each mini well does not tend towards a significant voltage, and remains neutral (HZ). The transistor FGT41 of the pair PR2 is subjected to a non-cumulative stress effect NCS, not very active due to the potential of 10 V applied to its control gate CG. As its drain region n1 is coupled to ground by means of the bitline BL, the conductive channel created in its channel region CH1 is maintained at 0 V and limits the injection of electrons into its floating gate.

In summary, memory cells according to this third embodiment may be read, erased, and programmed in a manner similar to those according to the second embodiment and shown in FIG. 6, with the difference that they do not employ a direct control of the electrical potential of the well PW containing the mini wells, the potential of each mini well being controlled during erase and program by means of the bitlines.

Moreover, as shown by the preceding description, the splitting of the well PW into mini wells MPW allows individual erasing and programming of each memory cell. The memory MEM1 previously described in relation with FIG. 23 may therefore be made with such memory cells to obtain a memory that is intrinsically and advantageously bit erasable and programmable. In practice, the control elements of the memory MEM1 may be configured to form a page- word- or bit-erasable memory, depending on the desired application. In particular, the bitline latches BLT are configured to control both the erase and program of memory cells by supplying the different bitline voltages that have just been described.

Figure 37A:
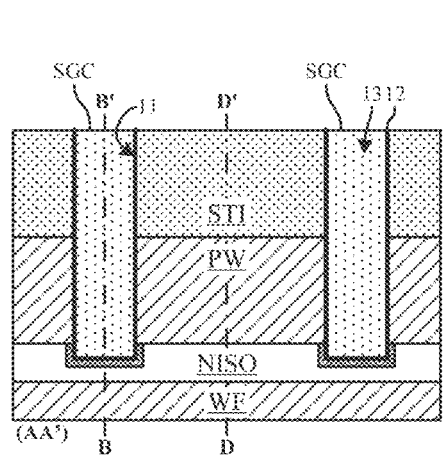
FIGS. 37A, 37B, 37C are cross-sectional views of another embodiment of memory cells according to the disclosure, which includes features implemented when a manufacturing step shown in FIG. 18B is performed.
Figure 37B:
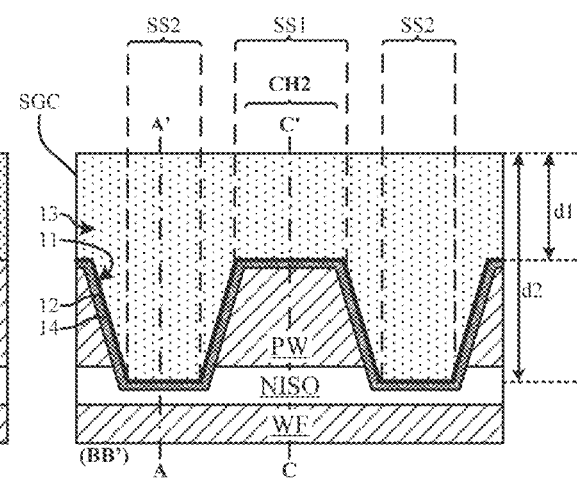

FIGS. 37A and 37B illustrate another embodiment of memory cells according to the disclosure and are respectively transversal and longitudinal cross-sectional views of conductive trenches SGC forming vertical gates of selection transistors and formed at step S41 (FIG. 18B) of the previously described manufacturing method. The cross-sectional view of FIG. 37A is along the cutting axis AA' shown in FIG. 18B, and the cross-sectional view of FIG. 37B is along the cutting axis BB' shown in FIG. 18B. Cutting axis AA' is shown in FIG. 37B and cutting axis BB' is shown in FIG. 37A.

As shown in FIG. 37A and as previously described in relation with FIGS. 18A, 18E, the conductive trenches SGC are formed in trenches 11 traversing the shallow trench isolations STI and the substrate PW. The substrate PW is formed in the wafer WF and is isolated therefrom by the N-doped isolation layer NISO. Each trench 11 is covered by the gate oxide layer 12, and is filled with a polycrystalline silicon layer 13 to form a conductive trench SGC. The lower side of each conductive trench is here bordered by a thin N-type region 14 implanted in the substrate PW.

As shown in FIG. 37B, each conductive trench SGC has a crenellated lower side, such that the depth of the conductive trench varies along its length. More particularly, the crenellated lower side defines, in each conductive trench, first sections SS1 having a minimum depth d1 and second sections SS2 having a maximum depth d2. The first sections SS1 extend in front of the channel regions CH2 of selection transistors. The second sections SS2 extend outside the channel regions and penetrate into the NISO layer. The N-type region 14, which borders the lower side of the conductive trenches, also penetrates into the NISO layer approximately at the level whereby the second sections penetrate into the buried source line. Between the first and second sections SS1, SS2, the conductive trenches may have transition sections with a depth varying between d1 and d2, where their lower side forms sloping walls with an inclined angle depending on the manufacturing method. As a numerical example, if depth d2 is 700 nanometers, depth d1 may be between 10% and 50% of d2, typically 100 nanometers to 350 nanometers.

Figure 37C:
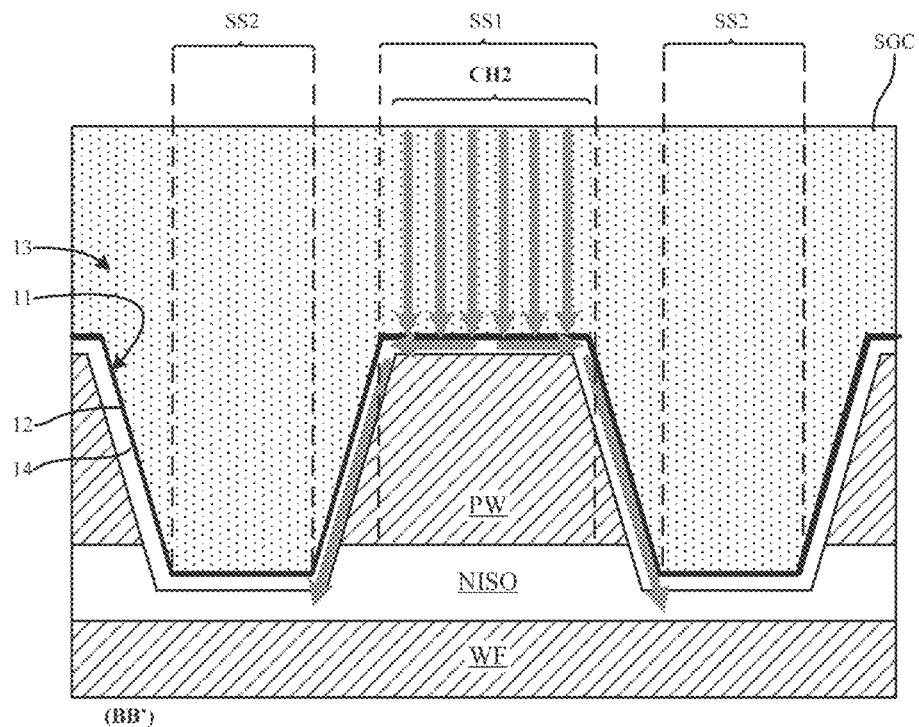

The distribution of current within a selection transistor is shown by arrows in FIG. 37C, which is a dilated representation of FIG. 37B. The current flows first through the drain region of the transistor (not shown), implanted on one side of the conductive trench SGC, then through the channel region CH2 of the transistor, extending in front of the first section SS1 of the conductive trench, then reaches the thin N-type region 14 acting as the common source region of the selection transistor and of another selection transistor whose channel extends in front of the other side of the first section SS1. The current then further flows through the N-type region 14, now acting as a conductor, along the sloped lower side of the transition sections of the conductive trench extending to the left and right of the first section SS1, until it reaches the NISO layer, at the level whereby second sections SS2 of the conductive trench penetrate into the buried source line. Consequently, the current flows in a plane parallel to that of FIG. 37C when it goes through the channel region CH2, then, after it has reached the N-type region 14, flows in a plane perpendicular to that of FIG. 37C along the lower side of the conductive trench.

It will be understood by the skilled person that the present embodiment forms an alternative to that of FIG. 7, in which the common vertical gate SGC does not reach the NISO layer, and in which a doped region n3'' is implanted between the lower side of the gate SGC and NISO layer. The present embodiment allows the length of the channels of the selection transistors, which is equal to d1, to be adjusted as needed, and the thin N-type region 14 replaces the thick doped region n3'' of FIG. 7, by allowing the current drawn by the selection transistors to reach the NISO layer acting as a source line. One advantage of the present embodiment is that it does not implant the thick doped region n3'' to couple the source regions of the transistors to the NISO layer. In some embodiments, the thin N-type region 14 may have a thickness comprised between 100 nanometers and 200 nanometers.

A method of manufacturing conductive trenches SGC with a crenellated lower side will now be described, referring to FIGS. 38A to 38C, 39A to 39D, 40A to 40C, 41A to 41C, and 42A to 42C, which respectively show steps S50, S51, S52, S53, and S54 of the method. FIGS. 38A, 39A, 40A, 41A, 42A are cross-sectional views of the substrate PW along the cutting axis AA'. FIGS. 38B, 39B, 40B, 41B, 42B are cross-sectional views of the substrate along a cutting axis CC parallel to AA', shown in FIG. 37B. FIGS. 38C, 39C, 40C, 41C, 42C are cross-sectional views of the substrate along the cutting axis BB', and FIG. 39D is a cross-sectional view of the substrate along a cutting axis DD' parallel to BB', shown in FIG. 37A.

Prior to these steps, parallel shallow trench isolations STI are formed (as shown in FIG. 18A) by etching the semiconductor PW and filling the obtained trenches with oxide, causing semiconductor strips $DS_j$, $DS_{j+1}$ to appear between the shallow trench isolations. The semiconductor strips are destined to later form the drain and source regions of transistors. The N-doped isolation layer NISO is then implanted in the wafer WF to delimit a P-type well PW forming the substrate PW.

At step S50, FIGS. 38A to 38C, an etching mask 10 and a resist layer 10' are deposited on the substrate PW and the shallow trench isolations STI. Patterns 11' are then formed in the resist layer 10'. Each pattern 11' has a rectangular shape perpendicular to the shallow trench isolations STI, corresponding to the desired shape of a trench 11 to be manufactured.

At step S51, FIGS. 39A to 39D, the etching mask 10 is etched through the patterns 11' of the resist layer 10', so that patterns 11' are transferred into the etching mask 10. The resist layer 10' is then removed. The view along axis DD' in FIG. 39D remains substantially unchanged for the rest of the process, and will not be shown again.

Figures 40A, 40B, 40C:
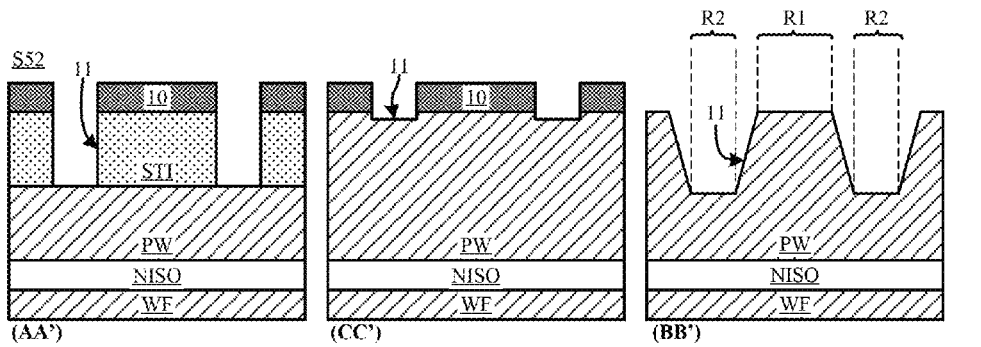

At step S52, FIGS. 40A to 40C, the shallow trench isolations STI are etched through patterns 11' of the etching mask 10, using an oxide selective etch process, until the substrate is reached. At this stage of the process and as shown in FIG. 40C, the trenches 11 are not totally formed and each trench 11 comprises a series of non-etched silicon regions R1 and of etched hollow regions R2 where trenches STI have been etched, along a line perpendicular to the STI trenches. Regions R2 have here inclined side walls, following the form of the trench previously made for the shallow trench isolation STI. Since the substrate PW may also be slightly etched in the exposed areas, such as shown in the view along axis CC', the term "non-etched region" should be understood as also meaning "slightly etched regions".

Figures 41A, 41B, 41C:
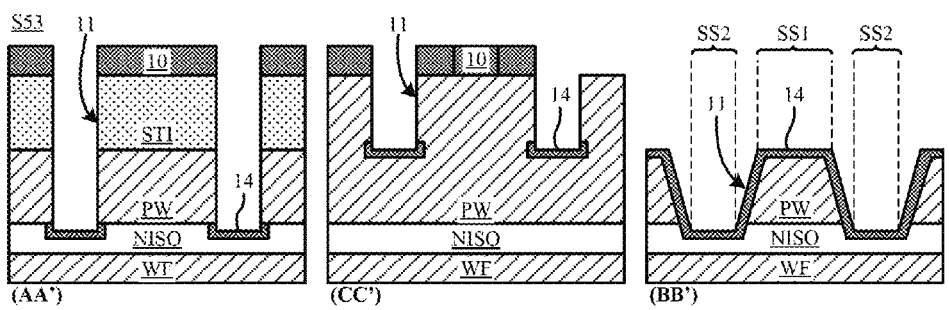

The manufacturing of the trenches 11 is completed at step S53, as shown in FIGS. 41A to 41C. The substrate PW is etched using a silicon selective etch process. The lower side of the trenches is thus "brought down" until the NISO layer is reached at the deeper portions of the trenches, as shown in FIG. 41A, 41C. Non-etched R1 silicon regions become the first section SS1 of depth d1 of trenches 11, and etched hollow regions R2 become the second sections SS2 of depth d2 of trenches 11. The NISO layer is not reached by sections SS1. N-doped regions 14 are then implanted in the substrate PW, through the lower sides of the trenches 11.

Figures 42A, 42B, 42C:
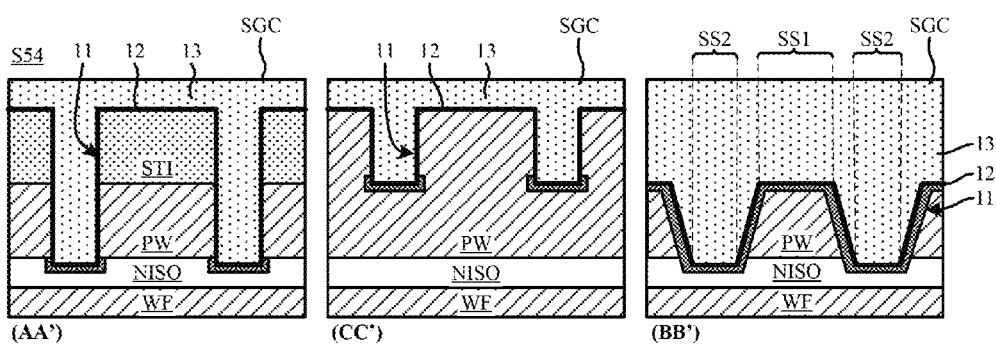

At step S54, FIGS. 42A to 42C, the etching mask 10 is removed, a gate oxide layer 12 is deposited on the substrate PW and in the trenches 11, and a layer of polycrystalline silicon 13 is then deposited on the substrate PW and in the trenches 11, above the oxide layer 12. The layer of polycrystalline silicon 13 and the oxide layer 12 are then removed from the surface of the substrate PW, as shown in FIGS. 37A and 37B, 37C. The conductive trenches 11 of polycrystalline silicon 13 remain, isolated from the substrate by the oxide layer 12.

The surface of the substrate is ready for other manufacturing steps. The steps previously described in relation with FIGS. 18C to 18E may then be implemented to deposit oxide, to form floating gates and conductive lines $CG_i$, $CG_{i+1}$, $CG_{i+2}$, $CG_{i+3}$, drain n1 and source n2 regions of the floating gate transistors, and contacts C1, C3, C4. This embodiment of the disclosure, as those previously described, can be used to manufacture an array of memory cells, such as MEM1 in FIG. 23 or MEM2 in FIG. 24.

It will also be understood by the skilled person that a memory cell according to the disclosure and a memory according to the disclosure are susceptible to various other implementations and applications. In particular, even though embodiments of memory cells with floating gate transistors have been described in the preceding, other types of charge accumulation transistors may be used, for example transistors comprising silicon dots embedded in a dielectric material, which allow the accumulation of electrical charges and replace the floating gates.

Annex 1 Forming an Integral Part of the Description
References Attributed to the Voltages

| REF1 | Voltages applied to the cells C11, C12 |
|---|---|
| BLV | Voltage applied to a bitline BL |
| CGV | Voltage applied to the control gate of a transistor FGT11, FGT12 |
| VB | Voltage applied to the substrate PW (well) |
| SV | Voltage applied to the gate of a transistor ST11, ST12 |
| SLV | Voltage applied to the source line SL |
| VI | Voltage applied to the NISO layer |

| REF2 | Voltages applied to the cells C21, C22 |
|---|---|
| BLV | Voltage applied to a bitline BL |
| CGV | Voltage applied to the control gate of a transistor FGT21, FGT22 |
| VB | Voltage applied to the substrate PW (well) |
| SV | Voltage applied to the gate of a transistor ST21, ST22 |
| SLV | Voltage applied to the NISO layer as a source line SL |

| REF3 | Voltages applied to the cells C31, C32 |
|---|---|
| BLV | Voltage applied to a bitline BL |
| CGV | Voltage applied to the control gate of a transistor FGT31, FGT32 |
| VB | Voltage applied to the substrate PW (well) |
| SV | Voltage applied to the common gate SGC of transistors ST31, T32 |
| SLV | Voltage applied to the NISO layer as a source line SL |

Voltage Values Examples During the Read of a Memory Cell

| RD1 | Ref. | Ex. | Read of the cell C11 (Prior Art) |
|---|---|---|---|
| BLV | BLV1 | 1 V | Read biasing voltage |
| CGV | Vread | 1.2 V | Read voltage of the transistor FGT11 |
| CGV | Vnread | VB1 | Non-read voltage applied to FGT12 |
| VB | VB1 | GND | Biasing voltage during the read |
| SV | Von | 2 V | Read selection voltage applied to ST11 |
| SV | Voff | GND | Read blocking voltage applied to ST12 |
| SLV | SLV1 | GND | Biasing voltage during the read |
| VI | VI1 | GND | Biasing voltage during the read |

| RD2 | Ref. | Ex. | Read of the cell C11 |
|---|---|---|---|
| BLV | BLV1 | 1 V | Read biasing voltage |
| CGV | Vread | 1.2 V | Read voltage of the transistor FGT11 |

-continued

| | | | |
|---|---|---|---|
| CGV | Vinh | −2 V | Inhibition voltage of the transistor FGT12 |
| VB | VB1 | GND | Biasing voltage during the read |
| SV | Von | 2 V | Read selection voltage of the transistors ST11, ST12 |
| SLV | SLV1 | GND | Biasing voltage during the read |
| VI | VI1 | GND | Biasing voltage during the read |

| RD3 | Ref. | Ex. | Read of the cell C21 |
|---|---|---|---|
| BLV | BLV1 | 1 V | Read biasing voltage |
| CGV | Vread | 1.2 V | Read voltage of the transistor FGT21 |
| CGV | Vinh | −2 V | Inhibition voltage of the transistor FGT22 |
| VB | VB1 | GND | Biasing voltage during the read |
| SV | Von | 2 V | Read selection voltage of the transistors ST21, T22 |
| SLV | SLV1 | GND | Biasing voltage during the read |

| RD4 | Ref. | Ex. | Read of the cell C31, FIG. 9 |
|---|---|---|---|
| BLV | BLV1 | 1 V | Read biasing voltage |
| CGV | Vread | 1.2 V | Read voltage of the transistor FGT31 |
| CGV | Vinh | −2 V | Inhibition voltage of the transistor FGT32 |
| VB | VB1 | GND | Biasing voltage during the read |
| SV | Von | 2 V | Read selection voltage of the transistors ST31, T32 |
| SLV | VI1 | GND | Biasing voltage during the read |

Voltage Value Examples During the Erasure of a Memory Cell

| ER1 | Ref. | Ex. | Erasure of the cell C11 (Prior Art) |
|---|---|---|---|
| BLV | BLV2 | HZ | Biasing voltage during erasure |
| CGV | Ver | −10 V | Erase voltage of the transistor FGT11 |
| CGV | Vner | 2.5 V | Non-erase voltage of the transistor FGT12 |
| VB | VB2 | 5 V | Biasing voltage during erasure |
| SV | SV2 | 5 V | Biasing voltage during erasure |
| SLV | SLV2 | HZ | Biasing voltage during erasure |
| VI | VI2 | 5 V | Biasing voltage during erasure |

| ER2 | Ref. | Ex. | Erasure of the cell C31, FIG. 11 |
|---|---|---|---|
| BLV | BLV2 | HZ | Biasing voltage during erasure |
| CGV | Ver | −10 V | Erase voltage of the transistor FGT31 |
| CGV | Vner | 2.5 V | Non-erase voltage of the transistor FGT32 |
| VB | VB2 | 5 V | Biasing voltage during erasure |
| SV | SV2 | 5 V | Biasing voltage during erasure |
| SLV | VI2 | 5 V | Biasing voltage during erasure |

Voltage Value Examples During the Programming of a Memory Cell

| PG1 | Ref. | Ex. | Programming of the cell C11 (Prior Art) |
|---|---|---|---|
| BLV | BLV3 | −5 V | Biasing voltage during the programming |
| CGV | Vprog | 10 V | Programming voltage of the transistor FGT11 |
| CGV | Vnprog | −2.5 V | Non-programming voltage of the transistor FGT12 |
| VB | VB3 | −5 V | Biasing voltage during the programming |
| SV | SV3 | −5 V | Biasing voltage during the programming |
| SLV | SLV3 | HZ | Biasing voltage during the programming |
| VI | VI3 | GND | Biasing voltage during the programming |

| PG2 | Ref. | Ex. | Programming of the cell C31, FIG. 12 |
|---|---|---|---|
| BLV | BLV3 | −5 V | Biasing voltage during the programming |
| CGV | Vprog | 10 V | Programming voltage of the transistor FGT31 |
| CGV | Vnprog | −2.5 V | Non-programming voltage of the transistor FGT32 |
| VB | VB3 | −5 V | Biasing voltage during the programming |
| SV | SV3 | −5 V | Biasing voltage during the programming |
| SLV | VI3 | GND | Biasing voltage during the programming |

| PG2' | Ref. | Ex. | Voltages sustained by a neighboring cell |
|---|---|---|---|
| BLV | BLV3' | GND | Non-programming voltage |
| CGV | Vprog | 10 V | Voltage sustained by the transistor FGT31' |
| CGV | Vnprog | −2.5 V | Voltage sustained by the transistor FGT32' |
| VB | VB3 | −5 V | Biasing voltage during the programming |
| SV | SV3 | −5 V | Voltage sustained by the transistors ST31', ST32' |
| SLV | VI3 | GND | Biasing voltage during the programming |

Voltage Value Examples During the Read of a Memory Cell (FIG. 25)

| RD5 Voltage | Line | Value | Status |
|---|---|---|---|
| BLV | BL | 1 V | Selected bitline (BL) |
| BLV | BL | HZ | Non-selected bitline |
| MCGV | MCGL | 1.2 V | Selected main control gate line |
| MCGV | MCGL | −2 V | Non-selected main control gate line paired with the selected main control gate line |
| MCGV | MCGL | GND | Non-selected main control gate line pairs |
| CGV | CGL | 1.2 V | Selected control gate line |
| CGV | CGL | −2 V | Non-selected control gate line paired with the selected control gate line |
| CGV | CGL | GND | Non-selected control gate line not paired with the selected control gate line |
| VB | — | GND | Selected well |
| VB | — | GND | Non-selected well |
| VB | — | −2 V | Switch well SS, CS |
| SV | WL | 2 V | Selected wordline |
| SV | WL | GND | Non-selected wordline |
| SLV | NISO | GND | Voltage of the source line and of NISO layer |
| SEL | — | 5 V | Control of switches SS of the selected well |
| NOSEL | — | −2 V | Control of switches CS of the selected well |
| SEL | — | 5 V | Control of switches SS of the non-selected well |
| NOSEL | — | −2 V | Control of switches CS of the non-selected well |

Voltage Value Examples During Erasure of a Word (FIG. 26)

| ER3 Voltage | Line | Value | Status |
|---|---|---|---|
| BLV | BL | HZ | Selected bitline (BL) |
| BLV | BL | HZ | Non-selected bitline |
| MCGV | MCGL | −10 V | Selected main control gate line |
| MCGV | MCGL | 2.5 V | Non-selected main control gate line paired with the selected main control gate line |
| MCGV | MCGL | 2.5 V | Non-selected main control gate line not paired with the selected control gate line |
| CGV | CGL | −10 V | Selected control gate line |
| CGV | CGL | 2.5 V | Non-selected control gate line paired with the selected control gate line |
| CGV | CGL | 2.5 V | Non-selected control gate line in selected well, not paired with the selected control gate line |
| CGV | CGL | GND | Non-selected control gate line in non-selected well |
| VB | — | 5 V | Selected well |

-continued

| ER3 Voltage | Line | Value | Status |
|---|---|---|---|
| VB | — | GND | Non-selected well |
| VB | — | −10 V | Switch well SS, CS |
| SV | WL | GND | Selected wordline |
| SV | WL | GND | Non-selected wordline |
| SLV | NISO | 5 V | Voltage of the source line and of NISO layer |
| SEL | — | 5 V | Control of switches SS of the selected well |
| NOSEL | — | −10 V | Control of switches CS of the selected well |
| SEL | — | −10 V | Control of switches SS of the non-selected well |
| NOSEL | — | 5 V | Control of switches CS of the non-selected well |

Voltage Value Examples During the Programming of a Word (FIG. 27)

| PG3 Voltage | Line | Value | Status |
|---|---|---|---|
| BLV | BL | −5 V | Selected bitline (BL) |
| BLV | BL | GND | Non-selected bitline in selected well |
| BLV | BL | HZ | Non-selected bitline in non-selected well |
| MCGV | MCGL | 10 V | Selected main control gate line |
| MCGV | MCGL | −2.5 V | Non-selected main control gate line paired with the selected main control gate line |
| MCGV | MCGL | −2.5 V | Non-selected main control gate line not paired with the selected main control gate line |
| CGV | CGL | 10 V | Selected control gate line |
| CGV | CGL | −2.5 V | Non-selected control gate line paired with the selected control gate line |
| CGV | CGL | −2.5 V | Non-selected control gate line in selected well, not paired with the selected control gate line |
| CGV | CGL | GND | Non-selected control gate line in non-selected well |
| VB | — | −5 V | Selected well |
| VB | — | GND | Non-selected well |
| VB | — | −2.5 V | Switch well SS, CS |
| SV | WL | −5 V | Selected wordline |
| SV | WL | −5 V | Non-selected wordline |
| SLV | NISO | GND | Voltage of the source line and of NISO layer |
| SEL | — | 13 V | Control of switches SS of the selected well |
| NOSEL | — | −2.5 V | Control of switches CS of the selected well |
| SEL | — | −2.5 V | Control of switches SS of the non-selected well |
| NOSEL | — | 5 V | Control of switches CS of the non-selected well |

Annex 2 Forming an Integral Part of the Description
Voltage Value Examples During the Read of a Memory Cell (FIGS. 31 and 32)

| RD6 Voltage | Ref. | Value | Status |
|---|---|---|---|
| BLV | BLV1 | 1 V | Selected bitline (BL) |
| BLV | BLV1' | HZ | Non-selected bitline (BL) |
| CGV | Vread | 1.2 V | Selected control gate line |
| CGV | Vinh | −2 V | Non-selected control gate line paired with the selected control gate line |
| CGV | Vnsel | GND | Non-selected control gate line not paired with the selected control gate line |
| VB | VB1 | HZ | Mini well comprising at least one memory cell selected for read |
| VB | VB1' | HZ | Mini well comprising two non-selected memory cells and coupled to a selected bitline (BL) |
| VB | VB1" | HZ | Mini well comprising two non-selected memory cells and coupled to a non-selected bitline (BL) |
| SV | Von | 2 V | Selected wordline (WL) |
| SV | Voff | GND | Non-selected wordline (WL) |
| SLV | VI1 | GND | Voltage of the source line and of the NISO layer |

Voltage Value Examples During the Erasure of a Memory Cell (FIGS. 33 and 34)

| ER4 Voltage | Ref. | Value | Status |
|---|---|---|---|
| BLV | BLV2 | 5 V | Selected bitline (BL) |
| BLV | BLV2' | GND | Non-selected bitline (BL) |
| CGV | Ver | −10 V | Selected control gate line |
| CGV | Vner | 2.5 V | Non-selected control gate line paired with the selected control gate line |
| CGV | Vner | 2.5 V | Non-selected control gate line not paired with the selected control gate line |
| VB | VB2 | 5 V (HZ) | Mini well comprising at least one memory cell selected for erasure |
| VB | VB2' | ≤5 V (HZ) | Mini well comprising two non-selected memory cells and coupled to a selected bitline (BL) |
| VB | VB2" | ≤0.6 V (HZ) | Mini well comprising two non-selected memory cells and coupled to a non-selected bitline (BL) |
| SV | Voff | GND | Selected wordline (WL) |
| SV | Voff | GND | Non-selected wordline (WL) |
| SLV | VI2 | 5 V | Voltage of the source line and of the NISO layer |

Voltage Value Examples During the Programming of a Memory Cell (FIGS. 35 and 36)

| PG4 Voltage | Ref. | Value | Status |
|---|---|---|---|
| BLV | BLV3 | −5 V | Selected bitline (BL) |
| BLV | BLV3' | GND | Non-selected bitline (BL) |
| CGV | Vprog | 10 V | Selected control gate line |
| CGV | Vnprog | −2.5 V | Non-selected control gate line paired with the selected control gate line |
| CGV | Vnprog | −2.5 V | Non-selected control gate line not paired with the selected control gate line |
| VB | VB3 | −4.4 V (HZ) | Mini well comprising at least one memory cell selected for programming |
| VB | VB3' | −4.4 V (HZ) | Mini well comprising two non-selected memory cells and coupled to a selected bitline (BL) |
| VB | VB3" | HZ | Mini well comprising two non-selected memory cells and coupled to a non-selected bitline (BL) |
| SV | SV3 | −5 V | Selected wordline (WL) |
| SV | SV3 | −5 V | Non-selected wordline (WL) |
| SLV | VI3 | GND | Voltage of the source line and of the NISO layer |

The various embodiments described above can be combined to provide further embodiments. These and other changes can be made to the embodiments in light of the above-detailed description. In general, in the following claims, the terms used should not be construed to limit the claims to the specific embodiments disclosed in the specifi-

The invention claimed is:

1. An integrated circuit comprising:
a buried source line buried in a semiconductor substrate; and
first and second memory cells formed in the semiconductor substrate and including first and second selection transistor, respectively, the first selection transistor including a buried gate, wherein:
the buried gate has a crenellated lower side defining, in a longitudinal cross-sectional plane of the gate, a first section of a first depth extending in front of a vertical channel region of the first selection transistor, and a second section of a second depth greater than the first depth and penetrating into the buried source line, and
the first selection transistor having a doped source region bordering the lower side of the buried gate and reaching the buried source line at a level at which the second section of the buried gate penetrates into the buried source line, whereby the source region is coupled to the buried source line.

2. An integrated circuit according to claim 1, wherein the memory cells are formed in a well of the semiconductor substrate, said buried source line being an isolation layer that delimits the well.

3. An integrated circuit according to claim 1, comprising:
a memory that includes the first and second memory cells, a first row of memory cells, and a second row of memory cells, each memory cell of the first and second rows including a selection transistor; and
a conductive trench with a crenellated lower side defining, in the conductive trench, a plurality of first sections of the first depth and of second sections of the second depth, each first section of the conductive trench forming a common gate of the selection transistor of a respective one of the memory cells of the first row of memory cells and of the selection transistor of a respective one of the memory cells of the second row of memory cells.

4. An integrated circuit according to claim 1, comprising:
a memory that includes the first and second memory cells, a first row of memory cells, and a second row of memory cells, each memory cell of the first and second rows including a selection transistor; and
a first conductive trench with a crenellated lower side defining, in the conductive trench, a first plurality of first sections of the first depth and a first plurality of second sections of the second depth, the first sections of the first plurality forming respective gates of the selection transistors of the memory cells of the first row of memory cells.

5. An integrated circuit according to claim 4, comprising:
a second conductive trench with a crenellated lower side defining, in the second conductive trench, a second plurality of first sections of the first depth and a second plurality of second sections of the second depth, the first sections of the second plurality of first sections forming respective gates of the selection transistors of the memory cells of the second row of memory cells; and
an isolating trench extending longitudinally transversely to the conductive trenches, and delimiting the conductive trenches from each other.

6. An integrated circuit according to claim 1, wherein the integrated circuit comprises at least two rows of memory cells, each including groups of individually-erasable memory cells formed in different wells of the semiconductor substrate.

7. An integrated circuit according to claim 1, wherein:
the buried gate has a first bottom surface at the first section;
the substrate includes a doped portion that is doped according to a first conductivity type and is positioned between the first bottom surface of the buried gate and the buried source line; and
the doped source region is part of a doped layer that is doped according to a second conductivity type opposite to the first conductivity type, the doped layer being positioned between the first bottom surface of the buried gate and a top of the doped portion of the substrate and extending downwardly along a side of the doped portion to the buried source line.

8. An integrated circuit according to claim 7, wherein the buried gate has a second bottom surface at the second section and the integrated circuit includes an insulating layer that lines the first and second bottom surfaces of the buried gate and insulates the doped source region from the buried gate.

9. An integrated circuit according to claim 1, wherein the buried gate is a buried gate shared in common by the first and second selection transistors.

10. An integrated circuit according to claim 1, wherein the first section of the bottom side is positioned above a top side of the buried source line, the buried gate also including a sloped wall extending from the first section to the second section.

11. A method, comprising:
manufacturing first and second memory cells on a semiconductor substrate, the first and second memory cells including first and second selection transistors, respectively, the manufacturing including:
implanting a buried source line in the substrate,
forming in the substrate a buried gate of the first selection transistor, the buried gate having a crenellated lower side defining, in a longitudinal cross-sectional plane of the gate, a first section of a first depth, and a second section of a second depth greater than the first depth and penetrating into the buried source line, and
bordering a lower side of the buried gate with a doped region forming a source region of the first selection transistor and reaching the buried source line at the level where the second section of the buried gate penetrates into the buried source line, whereby the source region is coupled to the buried source line.

12. A method according to claim 11, wherein implanting the buried source line includes forming the buried source line surrounding a well in which the memory cells are formed.

13. A method according to claim 12, wherein forming the buried gate comprises:
forming isolation trenches in the substrate,
selectively etching the isolation trenches along a line perpendicular to the isolation trenches, the selectively etching exposing, along said line, etched first regions of the substrate interspersed with non-etched second regions,
forming a trench having first regions of a third depth and second regions of a fourth depth by etching the substrate in the first and second etched,
depositing an isolation layer in the trench, and
filling the trench with a conductive material.

14. A method according to claim 13, wherein bordering the lower side of the buried gate with the doped region comprises implanting the doped region in the substrate through a lower side of the trench before depositing the isolation layer in the trench.

15. An integrated circuit comprising:
a conductive layer buried in a semiconductor substrate;
first and second wells formed in the semiconductor substrate, the first and second wells being first conduction regions of first and second transistors, respectively;
a first buried gate line buried in the semiconductor substrate, the first buried gate line having a first plurality of first sections having first bottom sides that do not reach the conductive layer and a first plurality of second sections having second bottom sides that penetrate into the conductive layer, the first and second sections alternating with one another and the first sections being first and second buried gates of the first and second transistors, respectively; and
a plurality of doped regions bordering the second bottom sides of the second sections and reaching the conductive layer, the doped regions electrically coupling the respective second sections to the conductive layer.

16. An integrated circuit according to claim 15, comprising a memory having first and second memory cells, wherein the first and second transistors are first and second selection transistors of the first and second memory cells, respectively.

17. An integrated circuit according to claim 16, wherein: the memory includes:
    a first row of memory cells that includes the first and second memory cells; and
    a second row of memory cells, the memory cell of the first and second rows respectively including respective selection transistors, and the second row including a third memory cell; and
the first buried gate of the first selection transistor is shared by the selection transistor of the third memory cell.

18. An integrated circuit according to claim 17, wherein in memory includes:

a third row of memory cells, the memory cells of the third row respectively including respective selection transistors;
a second buried gate line buried in the semiconductor substrate, the second buried gate line having a second plurality of first sections having bottom sides that do not reach the conductive layer and a second plurality of second sections having bottom sides that penetrate into the conductive layer, the first and second sections of the second buried gate line alternating with one another and the first sections of the second buried gate line being respective buried gates of the selection transistors of the third row of memory cells; and
an isolating trench extending longitudinally transversely to the first and second buried gate lines, and delimiting the buried gate lines from each other.

19. An integrated circuit according to claim 15, wherein:
the substrate includes plural doped portions that are doped according to a first conductivity type and are respectively positioned between the bottom sides of the first sections of the first buried gate and the conductive layer; and
the plurality of doped regions are part of a doped layer that is doped according to a second conductivity type opposite to the first conductivity type, the doped layer being positioned between the first bottom sides of the buried gate and tops of the doped portions of the substrate and extending downwardly along sides of the doped portions to the conductive layer.

20. An integrated circuit according to claim 19 wherein the integrated circuit includes an insulating layer that lines the first and second bottom sides of the buried gate and insulates the doped source regions from the buried gate line.

* * * * *